US012796132B2

(12) United States Patent
Takeda et al.

(10) Patent No.: US 12,796,132 B2
(45) Date of Patent: Nov. 10, 2026

(54) OPTICAL SEMICONDUCTOR DEVICE

(71) Applicant: KANEKA CORPORATION, Osaka (JP)

(72) Inventors: Rina Takeda, Settsu (JP); Yuta Saito, Settsu (JP)

(73) Assignee: KANEKA CORPORATION, Osaka (JP)

( * ) Notice: Subject to any disclaimer, the term of this patent is extended or adjusted under 35 U.S.C. 154(b) by 319 days.

(21) Appl. No.: 18/397,380

(22) Filed: Dec. 27, 2023

(65) Prior Publication Data

US 2024/0290804 A1 Aug. 29, 2024

(30) Foreign Application Priority Data

Dec. 28, 2022 (JP) ................................ 2022-211374

(51) Int. Cl.
*H01L 27/146* (2006.01)
*H10F 39/00* (2025.01)

(52) U.S. Cl.
CPC ......... *H10F 39/804* (2025.01); *H10F 39/811* (2025.01)

(58) Field of Classification Search
CPC ............................ H10F 39/804; H10F 39/811
USPC .......................................................... 257/431
See application file for complete search history.

(56) References Cited

U.S. PATENT DOCUMENTS

| | | | | |
|---|---|---|---|---|
| 6,262,479 B1 * | 7/2001 | Chou | H10F 39/804 257/700 |
| 2001/0020738 A1 * | 9/2001 | Lizima | H10F 39/804 257/680 |
| 2005/0001145 A1 * | 1/2005 | Minamio | H10F 39/80 250/214.1 |
| 2005/0074912 A1 * | 4/2005 | Yamauchi | H10F 39/804 438/26 |
| 2005/0109926 A1 | 5/2005 | Minamio et al. | |
| 2010/0003779 A1 * | 1/2010 | Watanabe | H10F 39/026 257/E21.499 |
| 2014/0284746 A1 * | 9/2014 | Suzuki | H10F 39/8063 257/432 |
| 2015/0264231 A1 | 9/2015 | Murayama et al. | |

(Continued)

FOREIGN PATENT DOCUMENTS

| | | |
|---|---|---|
| JP | 2005129720 A | 5/2005 |
| JP | 2011165774 A | 8/2011 |
| JP | 2014132644 A | 7/2014 |

OTHER PUBLICATIONS

Japan Patent Office, Office Action Issued in Application No. 2022-211374, Jul. 7, 2026, 2 pages.

*Primary Examiner* — Dzung Tran
(74) *Attorney, Agent, or Firm* — Alleman Hall LLP

(57) ABSTRACT

An optical semiconductor device includes a semiconductor substrate provided with a light-receiving element, a frame-shaped rib member, and a transparent substrate in this order, and an adhesive layer bonding the rib member and the semiconductor substrate to each other. The rib member and the adhesive layer are provided so as to surround the light-receiving element. In the optical semiconductor device, the adhesive layer protrudes outward from an outer peripheral surface of the rib member when the rib member and the adhesive layer are viewed from a transparent substrate side. A coverage ratio of the adhesive layer on an inner peripheral surface of the rib member is 30% or less.

8 Claims, 6 Drawing Sheets

(56) References Cited

U.S. PATENT DOCUMENTS

| | | | | |
|---|---|---|---|---|
| 2015/0325611 | A1* | 11/2015 | Jun ........................ | H10F 39/12 257/434 |
| 2016/0337561 | A1 | 11/2016 | Park et al. | |

* cited by examiner

OPTICAL SEMICONDUCTOR DEVICE

INCORPORATION BY REFERENCE

The present application claims priority under 35 U.S.C. § 119 to Japanese Patent Application No. 2022-211374, filed on Dec. 28, 2022. The contents of this application are incorporated herein by reference in their entirety.

TECHNICAL FIELD

The present invention relates to an optical semiconductor device.

BACKGROUND ART

Optical semiconductor devices such as CMOS sensors and CCD sensors are used in digital cameras, smartphones, and the like, and in recent years, the image sensors have been increasingly used and increasingly required to have a smaller size and higher definition along with the popularization of monitoring cameras in automobiles and factories.

An optical semiconductor device has, for example, a hollow structure in which a semiconductor substrate provided with a light-receiving element and a glass substrate are stacked with a frame-shaped rib member interposed therebetween. Patent Document 1 proposes an optical semiconductor device (solid-state imaging device) in which a rib member and a semiconductor substrate are bonded to each other with an adhesive interposed therebetween.

PRIOR ART DOCUMENT

Patent Document

Patent Document 1: Japanese Patent Laid-Open Publication No. 2005-129720

SUMMARY OF THE INVENTION

Problems to be Solved by the Invention

However, as optical semiconductor devices have been required to have a smaller size and higher definition in recent years, there have been cases where imaging characteristics are affected in conventional optical semiconductor devices. In particular, there has been found to be a problem that when intense light is incident, optical noise (specifically, flares, ghosts, and the like) is generated in formed images, so that expected imaging characteristics cannot be sufficiently exhibited.

It is difficult to improve bonding reliability between a rib member and a semiconductor substrate (in particular, reliability evaluated in a thermal shock test) simply by the technique disclosed in Patent Document 1.

In view of the above-described circumstances, an object of the present invention is to provide an optical semiconductor device which is excellent in reliability evaluated in a thermal shock test while suppressing generation of optical noise.

MEANS FOR SOLVING THE PROBLEMS

Aspects of the Invention

An aspect of the present invention is as follows.

[1] An optical semiconductor device including a semiconductor substrate provided with a light-receiving element, a frame-shaped rib member and a transparent substrate in this order, and an adhesive layer bonding the rib member and the semiconductor substrate to each other, in which the rib member and the adhesive layer are provided so as to surround the light-receiving element, the adhesive layer protrudes outward from an outer peripheral surface of the rib member when the rib member and the adhesive layer are viewed from a transparent substrate side, and a coverage ratio of the adhesive layer on an inner peripheral surface of the rib member is 30% or less.

[2] The optical semiconductor device according to [1], in which the coverage ratio of the adhesive layer on an end surface of the rib member on a semiconductor substrate side is less than 100%.

[3] The optical semiconductor device according to [2], in which the coverage ratio of the adhesive layer on the end surface of the rib member on the semiconductor substrate side is 60% or more.

[4] The optical semiconductor device according to any one of [1] to [3], in which the coverage ratio of the adhesive layer on the outer peripheral surface of the rib member is 15% or more.

[5] The optical semiconductor device according to any one of [1] to [4], in which an arithmetic mean roughness Ra of the inner peripheral surface of the rib member is 50 nm or more and 3,000 nm or less.

[6] The optical semiconductor device according to any one of [1] to [5], in which the rib member includes a cured product of a photosensitive composition, the photosensitive composition containing a curable compound having a polymerizable group, and a photopolymerization initiator, and has alkali solubility.

[7] The optical semiconductor device according to [6], in which the photosensitive composition further contains a coloring agent.

[8] The optical semiconductor device according to any one of [1] to [7], in which the coverage ratio of the adhesive layer on an end surface of the rib member on the semiconductor substrate side is 60% or more and 93% or less.

Effects of the Invention

According to the present invention, it is possible to provide an optical semiconductor device which is excellent in reliability evaluated in a thermal shock test while suppressing generation of optical noise.

MODE FOR CARRYING OUT THE INVENTION

Figure 1:
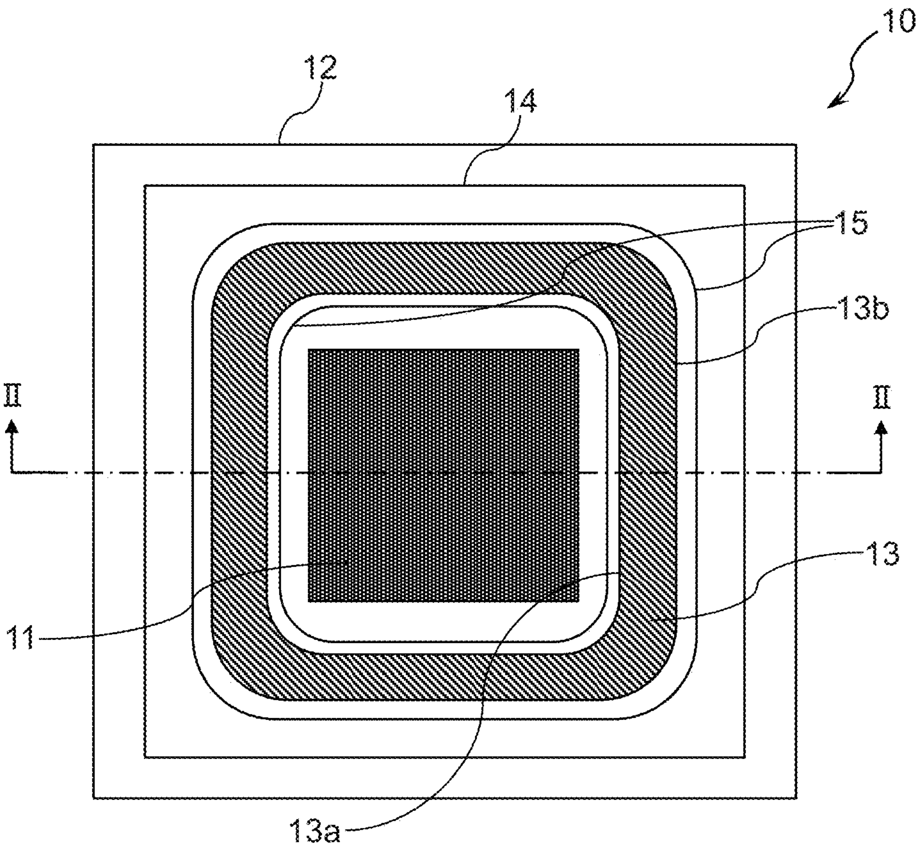
FIG. 1 is a plan view showing an example of an optical semiconductor device according to the present invention.

Preferred embodiments of the present invention will be described in detail below, but the present invention is not limited to these embodiments. The academic documents and patent documents mentioned herein are incorporated herein by reference in their entirety.

First, terms used herein will be described. The "principal surface" of a layered material (more specifically, transparent substrate, semiconductor substrate, wiring substrate, or the like) refers to a surface perpendicular to the thickness direction of the layered material. The "arithmetic mean roughness Ra" is measured by a method described in JIS B 0601: 2013. The "skewness Ssk" is measured by a method described in JIS B 0681-2: 2018.

The numerical value of the "thickness" of each layer forming the optical semiconductor device shows an "average thickness." The average thickness of each layer forming the optical semiconductor device is represented by an arithmetic average of ten measured values obtained by observing a cross-section of the layer cut in a thickness direction with an electron microscope, selecting ten measurement locations at random from the cross-sectional image, and measuring thicknesses at the ten selected measurement locations.

The term "polymerizable group" refers to a functional group which enables a polymerization reaction. The term "photopolymerization initiator" refers to a compound that generates an active species (specifically, radical, cation, anion, or the like) when irradiated with an active energy ray. The term "photocationic polymerization initiator" refers to a compound that generates a cation (acid) as an active species when irradiated with an active energy ray. The term "photoradical polymerization initiator" refers to a compound that generates a radical as an active species when irradiated with an active energy ray. Examples of the active energy ray include visible light rays, ultraviolet rays, infrared rays, electron beams, X-rays, $\alpha$-rays, $\beta$-rays, and $\gamma$-rays.

The term "cationically polymerizable group" refers to a functional group that causes a polymerization reaction in a chain reaction in the presence of a cation. The term "alicyclic epoxy group" refers to a functional group formed by bonding one oxygen atom to two adjacent carbon atoms among carbon atoms forming an alicyclic structure, and examples thereof include a 3,4-epoxycyclohexyl group. The term "radically polymerizable group" refers to a functional group having a radically polymerizable unsaturated bond. The term "semi-cured state" refers to a state in which the degree of curing can be further increased by a subsequent step (for example, a heating step).

The term "alkali-soluble group" refers to a functional group that enhances solubility in an alkaline solution by interacting with an alkali or reacting with an alkali. The phrase "a photosensitive composition has alkali-solubility" means that the photosensitive composition contains a compound having an alkali-soluble group.

The "polysiloxane compound" is a compound having a polysiloxane structure having a siloxane unit (Si—O—Si) as a constituent element. Examples of the polysiloxane structure include chain polysiloxane structures (specifically, linear polysiloxane structures, branched polysiloxane structures and the like) and cyclic polysiloxane structures.

Unless otherwise specified, the term "main component" of a material means a component contained in the material in the largest amount on a weight basis.

The term "solid content" is a nonvolatile component in the composition, and the term "total solid content" means the total amount of composition constituent components excluding solvents.

Hereinafter, the name of a compound may be followed by the term "-based" to collectively refer to the compound and derivatives thereof. The term "-based" following the name of a compound to express the name of a polymer means that repeating units of the polymer are derived from the compound or a derivative thereof. Acryl and methacryl may be collectively referred to as "(meth)acryl". Acrylate and methacrylate may be collectively referred to as "(meth)acrylate". Acryloyl and methacryloyl may be collectively referred to as "(meth)acryloyl".

The term "epoxy-based adhesive" refers to an adhesive containing a compound having an epoxy group (for example, a compound containing at least two epoxy groups in one molecule) as a main component. The term "acryl-based adhesive" refers to an adhesive containing (meth) acrylic acid or a derivative thereof (more specifically, (meth) acrylic acid ester or the like) or a polymer of (meth)acrylic acid or a derivative thereof as a main component.

Unless otherwise specified, one of the components, functional groups and the like shown in the present description may be used alone, or two or more thereof may be used in combination.

In the drawings that are referred to in the following description, mainly relevant components are schematically shown for easy understanding, and the size, the number, the shape, and the like of each illustrated component may be different from the actual counterparts for convenience of preparing the drawings. For convenience of description, there may be cases where in the drawings that are described later, the same component parts as those in the drawings described previously are given the same symbols, and descriptions thereof are omitted.

<Optical Semiconductor Device>

An optical semiconductor device (for example, a solid-state imaging device) according to the present embodiment includes a semiconductor substrate provided with a light-receiving element, a frame-shaped rib member, and a transparent substrate in this order, and an adhesive layer bonding the rib member and the semiconductor substrate to each other. The rib member and the adhesive layer are provided so as to surround the light-receiving element. In the optical semiconductor device according to the present embodiment, the adhesive layer protrudes outward from an outer peripheral surface of the rib member when the rib member and the adhesive layer are viewed from the transparent substrate side. A coverage ratio of the adhesive layer on an inner peripheral surface of the rib member is 30% or less.

The optical semiconductor device according to the present embodiment is excellent in reliability evaluated in a thermal shock test (hereinafter, sometimes referred to simply as "reliability") while suppressing generation of optical noise. The reason for this is presumed as follows.

In the optical semiconductor device according to the present embodiment, the adhesive layer protrudes outward from the outer peripheral surface of the rib member. That is, in the optical semiconductor device according to the present embodiment, a region where the adhesive layer protrudes is disposed along the outer periphery of the rib member, so that the rib member can be brought into close contact with the semiconductor substrate with stability in a thermal shock test. Thus, the optical semiconductor device according to the present embodiment is excellent in reliability.

In general, if intense light is incident on the optical semiconductor device, stray light is generated in a space inside the rib member (internal space of the rib member). The generated stray light is reflected by the inner peripheral surface of the rib member and incident on the light-receiving element, resulting in generation of optical noise. Studies by the present inventors have revealed that when the inner peripheral surface of the rib member is covered with an adhesive, stray light is easily reflected by the inner peripheral surface covered with the adhesive. In contrast, in the optical semiconductor device according to the present exemplary embodiment, reflection of stray light at the inner peripheral surface of the rib member can be suppressed because the coverage ratio of the adhesive layer on the inner peripheral surface of the rib member is 30% or less. Thus, the optical semiconductor device according to the present embodiment can suppress generation of optical noise.

[Configuration of Optical Semiconductor Device]

Figure 2:
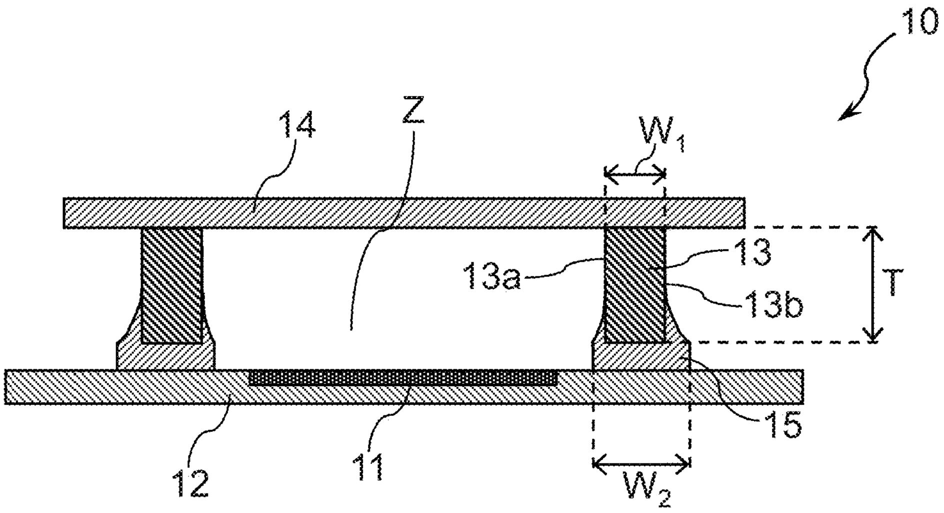
FIG. 2 is a sectional view taken along line II-II in FIG. 1.

Next, an example of the configuration of the optical semiconductor device according to the present embodiment will be described with reference to the drawings as appropriate. FIG. 1 is a plan view showing an example of an optical semiconductor device according to the present embodiment. FIG. 2 is a sectional view taken along line II-II in FIG. 1.

As shown in FIGS. 1 and 2, an optical semiconductor device 10 is a laminate including a semiconductor substrate 12 provided with a light-receiving element 11, a frame-shaped rib member 13, and a transparent substrate 14 in this order, and an adhesive layer 15 bonding the rib member 13 and the semiconductor substrate 12 to each other. The rib member 13 and the adhesive layer 15 is provided so as to surround the light-receiving element 11. As shown in FIG. 1 which is a plan view of the rib member 13 and the adhesive layer 15 viewed from the transparent substrate 14 side, the adhesive layer 15 protrudes outward from an outer peripheral surface 13*b* of the rib member 13. In the optical semiconductor device 10 shown in FIG. 1, the adhesive layer 15 also protrudes inward from an inner peripheral surface 13*a* of rib member 13.

(Transparent Substrate 14)

As the transparent substrate 14, for example, a glass substrate, a transparent plastic substrate (more specifically, an acrylic resin substrate, a polycarbonate substrate, or the like), or the like can be used, and a glass substrate is preferable from the viewpoint of reliability. The type of glass is not particularly limited, and examples thereof include quartz glass, borosilicate glass, and alkali-free glass. The thickness of the transparent substrate 14 is, for example, 50 μm or more and 2,000 μm or less.

If necessary, a covering film functioning as any of an infrared reflection film (or an infrared cut filter), an anti-reflection film (AR coating), an anti-reflection film, a protective film, a reinforcing film, a shielding film, a conductive film, an antistatic film, a low-pass filter, a high-pass filter and a band-pass filter may be formed on a surface of the transparent substrate 14. In particular, an anti-reflection film and an infrared reflection film (or an infrared cut filter) are preferable because optical noise of a captured image is further reduced.

In particular, when an antireflection film is used as the covering film, it is preferable to use a multi-layer anti-reflection film containing one or more inorganic materials selected from the group consisting of $TiO_2$, $Nb_2O_5$, $Ta_2O_5$, $CaF_2$, $SiO_2$, $Al_2O_3$, $MgS_2$, $ZrO_2$, NiO, and $MgF_2$.

The covering film can be provided on one principal surface or each of both principal surfaces of the transparent substrate 14. When the covering films are provided on both principal surfaces, the types of the covering films may be the same or different. Different types of covering films having the same function can also be stacked on one principal surface. Different types of covering films having different functions can also be stacked on one principal surface. The number of stacked layers is not particularly limited, and a multi-layer film having several to several ten layers may be formed.

(Rib Member 13)

The material of the rib member 13 is not particularly limited. Examples thereof include cured products of photosensitive compositions and cured products of thermosetting resins, and cured products of photosensitive compositions are preferable from the viewpoint of ease of patterning. That is, from the viewpoint of ease of patterning, it is preferable that the rib member 13 includes a cured product of the photosensitive composition. Details of the photosensitive composition will be described later.

The shape of the rib member 13 is not particularly limited as long as it is a frame shape. As an example of the frame shape, the rib member 13 having a quadrangle-cylindrical structure is shown in FIGS. 1 and 2, but for example, a rib member having a circular-cylindrical structure may be used, or a rib member having a polygonal-cylindrical structure other than the quadrangle-cylindrical structure may be used.

The length of one side of the rib member 13 is, for example, 0.1 mm or more and 5.0 mm or less, preferably 0.5 mm or more and 2.0 mm or less. The shape of each of the four corners of the rib member 13 is preferably a curved shape as shown in FIG. 1. When the shape of each of the four corners of the rib member 13 is a curved shape, concentration of stress on the four corners can be lessened to reduce peeling and cracking of the rib member 13 during solder reflow and a thermal shock test. For further reducing peeling and cracking of the rib member 13 during solder reflow and a thermal shock test, the curvature radii of the four corners of the rib member 13 on the outer periphery side and the inner periphery side are each preferably 0.01 mm or more and 1.0 mm or less.

For obtaining an optical semiconductor device which is further excellent in reliability, a thickness T (height) of the rib member 13 is preferably 500 μm or less, more preferably 400 μm or less, still more preferably 300 μm or less, even more preferably 150 μm or less, and may be 140 μm or less, 130 μm or less, 120 μm or less, 110 μm or less, or 100 μm or less. For further suppressing generation of optical noise, the thickness T (height) of the rib member 13 is preferably 10 μm or more, more preferably 12 μm or more, still more preferably 15 μm or more, even more preferably 20 μm or more, particularly preferably 25 μm or more.

For further downsizing the optical semiconductor device while enhancing adhesion between the transparent substrate 14 and the rib member 13, a width $W_1$ of the rib member 13 is preferably 10 μm or more and 300 μm or less, more preferably 20 μm or more and 250 μm or less.

(Adhesive Layer 15)

The adhesive layer 15 includes a cured product of an adhesive. Examples of the adhesive as a material for the adhesive layer 15 include epoxy-based adhesives, acryl-based adhesives, and the like. Examples of the epoxy-based adhesive include adhesives containing a compound having an epoxy group as a main component, and a photocationic polymerization initiator. Examples of the acryl-based adhesive include adhesives containing a radically polymerizable compound having a (meth)acryloyl group as a main component, and a photoradical polymerization initiator. The content of the polymerization initiator (a photocationic polymerization initiator, a photoradical polymerization initiator or the like) in the adhesive is, for example, 1 part by weight or more and 5 parts by weight or less, based on 100 parts by weight of the main component (a compound having an epoxy group, a radically polymerizable compound or the like).

For obtaining an optical semiconductor device which is further excellent in bondability between the semiconductor substrate 12 and the rib member 13, the adhesive as a material for the adhesive layer 15 is preferably an epoxy-based adhesive. When an epoxy-based adhesive is used as an adhesive as a material for the adhesive layer 15, the main component of the epoxy-based adhesive is preferably an aromatic epoxy compound having two or more epoxy groups, more preferably a bisphenol-based epoxy compound (more specifically, a bisphenol A-based epoxy compound, a bisphenol F-based epoxy compound, a bisphenol S-based epoxy compound or the like), still more preferably a bisphenol A-based epoxy compound for obtaining an optical semiconductor device which is further excellent in bondability between the semiconductor substrate 12 and the rib member 13.

The adhesive may contain additives such as a rheology modifier and a gap spacer. Examples of the rheology modifier include inorganic particles such as particles of fumed silica, precipitated silica, asbestos powder, copper oxide, copper hydroxide, iron oxide, alumina, zinc oxide, lead oxide, magnesia, tin oxide, calcium carbonate, carbon, mica, smectite, and carbon black; organic particles such as polystyrene beads, polyethylene particles, acrylic particles, polysiloxane particles, isoprene rubber particles, and polyamide particles; and organic compounds such as an amide wax, modified polyester polyol, ethyl cellulose, methyl cellulose, and organic bentonite. For adjusting the viscosity of the adhesive to be within a range suitable for application, the content of the rheology modifier in the adhesive is preferably 1 part by weight or more and 20 parts by weight or less, more preferably 5 parts by weight or more and 18 parts by weight or less, based on 100 parts by weight of the main component (a compound having an epoxy group, a radically polymerizable compound or the like).

When a gap spacer is blended in the adhesive, the thickness of the adhesive layer 15 can be easily adjusted to be within a preferable range described later. As the gap spacer, particles having a sharp particle size distribution are preferable. Examples of the material of the gap spacer include silica, calcium carbonate, resin, and rubber. The particle size of the gap spacer can be adjusted according to the thickness of the adhesive layer 15 formed. For adjusting the thickness of the adhesive layer 15 to be within a range described later, the content of the gap spacer in the adhesive is preferably 0.1 parts by weight or more and 5 parts by weight or less, more preferably 0.5 parts by weight or more and 2 parts by weight or less, based on 100 parts by weight of the main component (a compound having an epoxy group, a radically polymerizable compound or the like).

For enhancing the accuracy in application of the adhesive, the viscosity of the adhesive is preferably 10 Pa·s or more and 800 Pa·s or less, more preferably 50 Pa·s or more and 600 Pa·s or less.

A width $W_2$ of the adhesive layer 15 can be appropriately changed according to the width $W_1$ of the rib member 13, and is, for example, 10 μm or more and 500 μm or less, preferably 10 μm or more and 400 μm or less, more preferably 20 μm or more and 300 μm or less.

For obtaining an optical semiconductor device which is excellent in bondability between the rib member 13 and the semiconductor substrate 12 and further excellent in reliability, the interval between the rib member 13 and the semiconductor substrate 12 is preferably 0.01 μm or more and 100 μm or less, more preferably 0.1 μm or more and 80 μm or less, still more preferably 0.5 μm or more and 50 μm or less, even more preferably 1 μm or more and 30 μm or less. Hereinafter, the interval between the rib member and the semiconductor substrate is sometimes referred to as a "thickness of the adhesive layer."

(Semiconductor Substrate 12)

Examples of the semiconductor substrate 12 include image sensor substrates. The thickness of the semiconductor substrate 12 is, for example, 50 μm or more and 800 μm or less.

An internal space Z surrounded by the semiconductor substrate 12, the transparent substrate 14 and the rib member 13 may be a sealed space. Here, the rib member 13 functions as a partition wall that prevents ingress of moisture and dust into an effective image region. When ventilation holes are formed in the rib member 13, ingress of foreign matter into the internal space Z can be prevented by forming the rib member 13 in the shape of a maze.

In the optical semiconductor device 10, the coverage ratio of the adhesive layer 15 on the inner peripheral surface **13*a* of the rib member 13 is 30% or less. Hereinafter, the coverage ratio of the adhesive layer on the inner peripheral surface of the rib member is sometimes referred to as an "inner periphery coverage ratio." A method for measuring the inner periphery coverage ratio will be described with reference to FIG. 3 which is a partially enlarged sectional view showing the adhesive layer 15 and a periphery thereof in an enlarged form. The inner periphery coverage ratio is measured in an electron microscope image of a cross-section of the adhesive layer 15 and a periphery thereof. In the following description, a direction perpendicular to the thickness direction of the rib member 13 is an X direction, and a direction parallel to the thickness direction of the rib member 13** is a Y direction.

In the measurement of the inner periphery coverage ratio, first, the Y-direction length $L_1$ of the inner peripheral surface **13*a* and the Y-direction length $L_2$ of a region of the inner peripheral surface 13*a* which is covered with the adhesive layer 15** are measured in the electron microscope image. The inner periphery coverage ratio (unit: %) is calculated from the equation "inner periphery coverage ratio$=100\times L_2/L_1$."

For further suppressing generation of optical noise, the inner periphery coverage ratio is preferably 25% or less, more preferably 20% or less, still more preferably 15% or less, even more preferably 10% or less, particularly preferably 5% or less, and may be 0%.

Figure 3:
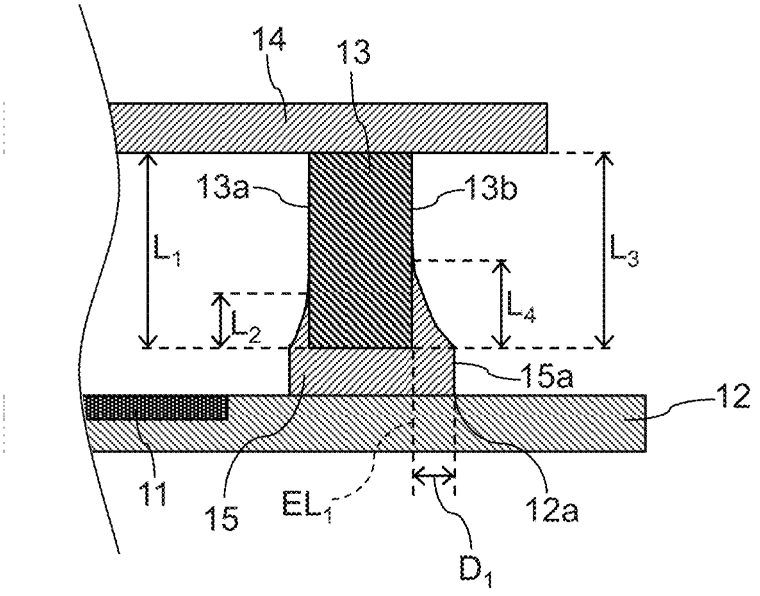
FIG. 3 is a partially enlarged sectional view showing an example of an optical semiconductor device according to the present invention.

As shown in FIG. 3, the adhesive layer 15 may cover at least a part of the outer peripheral surface 13*b* of the rib member 13. For obtaining an optical semiconductor device which is further excellent in reliability, the coverage ratio of the adhesive layer 15 on the outer peripheral surface 13*b* of the rib member 13 is preferably 5% or more, more preferably 10% or more, still more preferably 15% or more, even more preferably 20% or more, particularly preferably 25% or more, may be 30% or more, 40% or more, 50% or more, 60% or more, 70% or more, 80% or more, or 90% or more, and may be 100%. Hereinafter, the coverage ratio of the adhesive layer on the outer peripheral surface of the rib member is sometimes referred to as an "outer periphery coverage ratio."

The outer periphery coverage ratio can be measured by the same method as in the case of the inner periphery coverage ratio described above. Specifically, first, the Y-direction length $L_3$ of the outer peripheral surface 13*b* and the Y-direction length $L_4$ of a region of the outer peripheral surface 13*b* which is covered with the adhesive layer 15 are measured in the electron microscope image. The outer periphery coverage ratio (unit: %) is calculated from the equation "outer periphery coverage ratio=$100\times L_4/L_3$."

For further downsizing the optical semiconductor device while further improving the reliability of the optical semiconductor device, a shortest distance $D_1$ from a contact point 12*a* between an outer peripheral portion 15*a* of the adhesive layer 15 and the semiconductor substrate 12 to an extended line $EL_1$ of the outer peripheral surface 13*b* of the rib member 13 on a cross-section of the adhesive layer 15 (see FIG. 3) is preferably 10 μm or more and 75 μm or less. Hereinafter, the shortest distance from the contact point between the outer peripheral portion of the adhesive layer and the semiconductor substrate to the extended line of the outer peripheral surface of the rib member on a cross-section of the adhesive layer is sometimes referred to as a "protrusion length." For further downsizing the optical semiconductor device while further improving the reliability of the optical semiconductor device, the protrusion length is preferably 15 μm or more and 75 μm or less, more preferably 20 μm or more and 75 μm or less, still more preferably 25 μm or more and 75 μm or less, even more preferably 30 μm or more and 75 μm or less, and may be 35 μm or more and 75 μm or less, 40 μm or more and 75 μm or less, or 45 μm or more and 75 μm or less.

For further suppressing generation of optical noise, the arithmetic mean roughness Ra of the inner peripheral surface 13*a* of the rib member 13 is preferably 50 nm or more and 3,000 nm or less. When the arithmetic mean roughness Ra of the inner peripheral surface 13*a* is 50 nm or more and 3,000 nm or less, generated stray light is diffusely reflected in reflection by the inner peripheral surface 13*a*. The diffusely reflected stray light is not so intense that optical noise is generated, and therefore, even if the stray light is incident on the light-receiving element 11, generation of optical noise can be further suppressed when the arithmetic mean roughness Ra of the inner peripheral surface 13*a* is 50 nm or more and 3,000 nm or less. For further suppressing generation of optical noise, the arithmetic mean roughness Ra of the inner peripheral surface 13*a* of the rib member 13 is preferably 100 nm or more and 2,000 nm or less, more preferably 200 nm or more and 900 nm or less, still more preferably 350 nm or more and 850 nm or less. In the present specification, the phrase "arithmetic mean roughness Ra of the inner peripheral surface of the rib member" means the arithmetic mean roughness Ra of at least a part of the inner peripheral surface of the rib member. In addition, hereinafter, an irregular shape having an arithmetic mean roughness Ra of 50 nm or more and 3,000 nm or less is sometimes referred to simply as an "irregular shape."

For further suppressing generation of optical noise, the ratio of the area of regions formed in an irregular shape in the inner peripheral surface 13*a* of the rib member 13 is preferably 50% or more, more preferably 80% or more, still more preferably 90% or more, particularly preferably 100% (the entire surface is formed in an irregular shape) when the total area of the inner peripheral surface 13*a* of the rib member 13 is defined as 100%.

When the inner peripheral surface 13*a* is formed in an irregular shape, the skewness Ssk of the inner peripheral surface 13*a* is preferably a negative value, more preferably −0.80 or more and −0.10 or less, still more preferably −0.70 or more and −0.10 or less, even more preferably −0.70 or more and −0.20 or less for further suppressing generation of optical noise. The skewness Ssk indicates the symmetry of a height distribution with respect to an average level of the surfaces of irregularities. When the skewness Ssk is 0, the height distribution is a normal distribution (vertically symmetric). On the other hand, when the skewness Ssk is a negative value, the surface has many fine valleys, and when the skewness Ssk is a positive value, the surface has many fine mountains.

The irregular shape may be an ordered irregular shape or a disordered irregular shape as long as the arithmetic mean roughness Ra is 50 nm or more and 3,000 nm or less. For further reducing optical noise, it is preferable that the inner peripheral surface 13*a* is formed in a disordered irregular shape. When the irregular shape of the inner peripheral surface 13*a* is a disordered irregular shape, reflection light at the inner peripheral surface 13*a* can be more diffusely reflected.

On the inner peripheral surface 13*a* of the rib member 13, an irregular shape may be formed only in the X direction, an irregular shape may be formed only in the Y direction, or an irregular shape may be formed in both the X and Y directions. Here, the phrase "an irregular shape is formed only in the X direction (or the Y direction)" means that the irregular shape is observed only when scanning is performed in the X direction (or the Y direction), and the irregular shape is not observed when scanning is performed in a direction perpendicular to the X direction (or the Y direction). For further reducing optical noise, it is preferable that the inner peripheral surface 13*a* of the rib member 13 has an irregular shape formed in both the X and Y directions.

The method for forming an irregular shape on the inner peripheral surface 13*a* of the rib member 13 is not particularly limited, and examples thereof include a method in which the rib member 13 is formed from a material containing a filler, a method in which irregularities are formed using a mold, a method in which a photomask having irregularities is used in patterning of a photosensitive composition by photolithography, and a method in which by photolithography, the rib member 13 is formed from a photosensitive composition having a linear structure and a structure other than a linear structure.

In particular, a method in which by photolithography, the rib member 13 is formed from a photosensitive composition having a linear structure and a structure other than a linear structure is preferable because fine irregularities can be formed, the number of steps can be reduced, and a high-precision pattern shape can be easily formed. When by photolithography, the rib member 13 is formed from a photosensitive composition having a linear structure and a structure other than a linear structure, an irregular shape can be formed on a surface of the rib member 13 which includes the inner peripheral surface 13*a*. The reason for this may be that when a photosensitive composition having a linear structure and a structure other than a linear structure is used, a phase separation structure is developed in the photosensitive composition before the development step in photolithography, so that irregularities derived from the phase separation structure are formed on the surface of the rib member 13 after the development step.

Examples of the "structure other than a linear structure" include a branched chain structure, a network structure, and a cyclic structure, and for easily adjusting the arithmetic mean roughness Ra of the inner peripheral surface 13*a* of the rib member 13 to be within the range of 50 nm or more and 3,000 nm or less, the structure other than a linear structure is preferably a cyclic structure. The "photosensitive composition having a linear structure and a structure other than a linear structure" may contain a compound having a linear structure and a compound having a structure other than a linear structure, or may contain a compound having both a linear structure and a structure other than a linear structure. Examples of the compound having a linear structure include polysiloxane compounds having both a linear structure and a structure other than a linear structure, linear polysiloxane compounds, linear polyacrylate, linear polyether, linear polyester, linear polyimide, and linear polyolefin, and from the viewpoint of heat resistance, polysiloxane compounds having both a linear structure and a structure other than a linear structure or linear polysiloxane compounds are preferable.

When by photolithography, the rib member 13 is formed from a photosensitive composition having a linear structure and a structure other than a linear structure, the skewness Ssk of a surface of the rib member 13 which includes the inner peripheral surface 13*a* tends to be a negative value. On the other hand, when the rib member 13 is formed from a material containing a filler, the skewness Ssk of a surface of the rib member 13 which includes the inner peripheral surface 13*a* tends to be a positive value. Details of the photosensitive composition will be described later.

Figure 4:
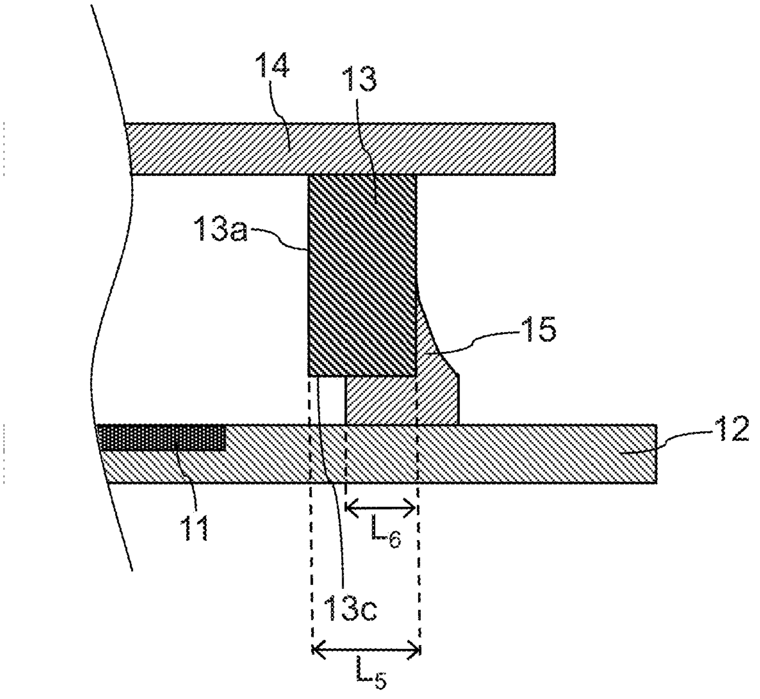
FIG. 4 is a partially enlarged sectional view showing another example of an optical semiconductor device according to the present invention.

The cross-sectional shape of the adhesive layer 15 is not limited to the shape shown in FIG. 3. The cross-sectional shape of the adhesive layer 15 may be a shape shown in FIG. 4. In FIG. 4, a part of an end surface 13*c* of the rib member 13 on the semiconductor substrate 12 side is not covered with the adhesive layer 15. For further suppressing generation of optical noise, the coverage ratio of the adhesive layer 15 on the end surface 13*c* of the rib member 13 on the semiconductor substrate 12 side is preferably less than 100% as shown in FIG. 4. Hereinafter, the coverage ratio of the adhesive layer on an end surface of the rib member on the semiconductor substrate side is sometimes referred to as an "end surface coverage ratio."

The end surface coverage ratio can be measured by the same method as in the case of the inner periphery coverage ratio described above. Specifically, first, the width-direction length $L_5$ of the rib member 13 at the end surface 13*c* and the width-direction length $L_6$ of a region of the end surface 13*c* which is covered with the adhesive layer 15 are measured in the electron microscope image. The end surface coverage ratio (unit: %) is calculated from the equation "end surface coverage ratio=$100\times L_6/L_5$."

For further suppressing generation of optical noise, the end surface coverage ratio is preferably 99% or less, and may be 98% or less, 97% or less, 96% or less, 95% or less, 94% or less, or 93% or less. For obtaining an optical semiconductor device which is further excellent in reliability, the end surface coverage ratio is preferably 60% or more, more preferably 65% or more, still more preferably 70% or more, even more preferably 75% or more, particularly preferably 77% or more.

When the end surface coverage ratio is less than 100%, normally an adhesive covering the inner peripheral surface 13*a* of the rib member 13 is not present as shown in FIG. 4. Thus, in the present specification, the inner periphery coverage ratio is 0% when the end surface coverage ratio is less than 100%.

Configurations of Other Embodiments

While an example of the configuration of the optical semiconductor device according to the present embodiment has been described above with reference to FIGS. 1 to 4, the present invention is not limited to the above-described embodiment. For example, the optical semiconductor device according to the present invention may include a wiring substrate shown in FIG. 5 while having the above-described configuration.

Figure 5:
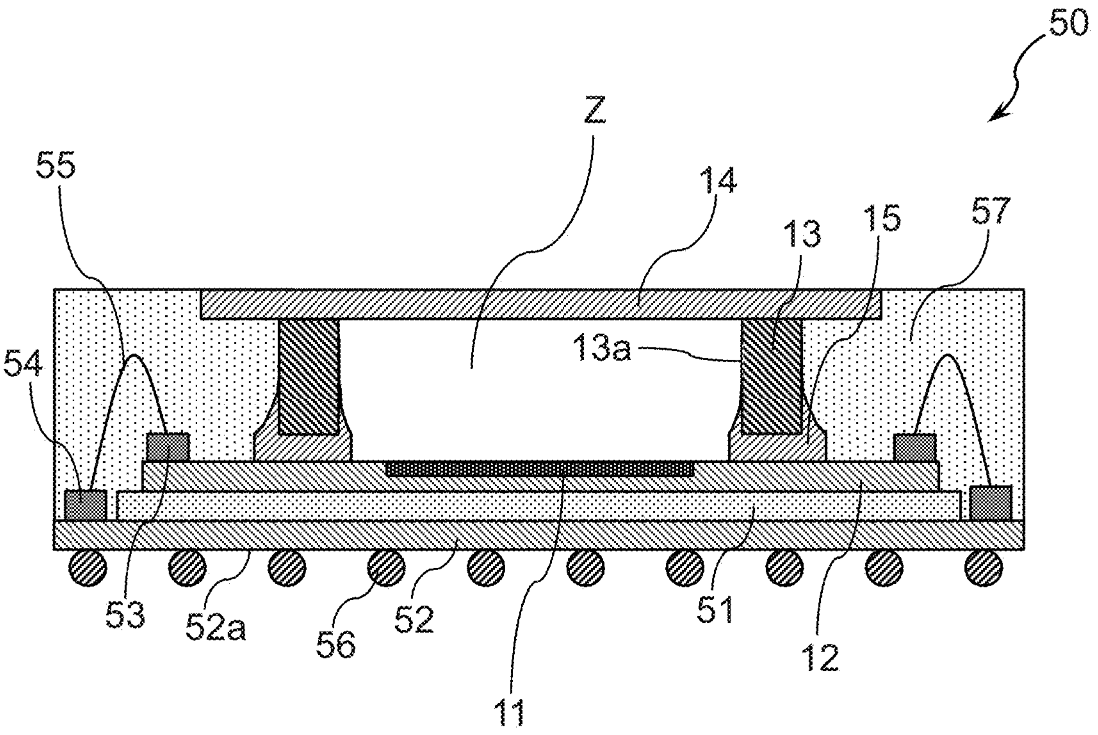
FIG. 5 is a sectional view showing another example of an optical semiconductor device according to the present invention.

FIG. 5 is a sectional view of an optical semiconductor device according to another embodiment. An optical semiconductor device 50 shown in FIG. 5 includes a wiring substrate 52 (interposer) bonded to a principal surface of the semiconductor substrate 12 on a side opposite to the transparent substrate 14 with a die bond material 51 interposed therebetween while having the configuration of the optical semiconductor device 10 shown in FIG. 2.

The semiconductor substrate 12 and the wiring substrate 52 are provided with a semiconductor substrate electrode pad 53 and a wiring substrate electrode pad 54, respectively. The semiconductor substrate electrode pad 53 and the wiring substrate electrode pad 54 are electrically connected through a metallic wire 55. The rib member 13 is disposed between the semiconductor substrate electrode pad 53 and the light-receiving element 11, and a peripheral portion of the rib member 13 (a region including the wire 55) is sealed with a sealing resin 57. A solder ball 56 (external connection terminal) is formed on a principal surface 52*a* of the wiring substrate 52 on a side opposite to the die bond material 51.

The die bond material 51 is not particularly limited, and is preferably a thermosetting resin such as an epoxy resin or a silicone resin which is not significantly degraded by reflow at a temperature of about 260 °C.

The wiring substrate 52 is a multi-layer wiring substrate including a glass epoxy resin base material or the like and metal wiring, and wiring and interlayer connection vias are formed on a surface of the wiring substrate and inside the wiring substrate. The wiring substrate 52 also has a function as a support substrate that suppresses deformation of the semiconductor substrate 12.

The sealing resin 57 is not particularly limited, and a thermosetting resin such as an epoxy resin, an acrylic resin or a silicone resin is preferable, and an epoxy resin is preferable from the viewpoint of toughness and heat resistance of the resin. From the viewpoint of reducing optical noise such as flares, the sealing resin 57 is preferably colored in black. From the viewpoint of handleability, it is preferable that the sealing resin 57 contains a filler such as silica and has thixotropy before curing.

[Photosensitive Composition]

Next, a photosensitive composition usable as a material for the rib member 13 will be described. Examples of the photosensitive composition usable as the material for the rib member 13 include photosensitive compositions which contain a curable compound having a polymerizable group and a photopolymerization initiator and have alkali solubility. Examples of the polymerizable group include cationically polymerizable groups such as an epoxy group, a glycidyl group, an oxetanyl group, a vinyl ether group, and an alkoxysilyl group, and radically polymerizable groups having a radically polymerizable unsaturated bond. From the viewpoint of the storage stability of the photosensitive composition, the cationically polymerizable group is preferably one or more selected from the group consisting of a glycidyl group, an alicyclic epoxy group and an oxetanyl group, more preferably one or more selected from the group consisting of a glycidyl group and an alicyclic epoxy group. Specific examples of the radically polymerizable group include a (meth)acryloyl group and a vinyl group. The curable compound having a polymerizable group may have one or both of a cationically polymerizable group and a radically polymerizable group in one molecule. A compound having a cationically polymerizable group and a compound having a radically polymerizable group may be used in combination.

The photosensitive composition contains a compound having an alkali-soluble group. The alkali-soluble group is preferably one or more selected from the group consisting of a monovalent organic group represented by the following chemical formula (X1) (hereinafter, sometimes referred to as an "X1 group"), a divalent organic group represented by the following chemical formula (X2) (hereinafter, sometimes referred to as an "X2 group"), a phenolic hydroxyl group, and a carboxy group. The X1 group is a monovalent organic group derived from a N-mono-substituted isocyanuric acid. The X2 group is a divalent organic group derived from a N,N'-disubstituted isocyanuric acid.

Chemical Formulas X1 and X2

(X1)

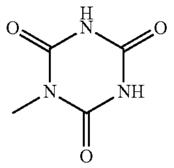

(X2)

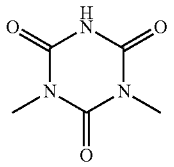

For forming the rib member 13 which is excellent in heat resistance, the alkali-soluble group is preferably one or more selected from the group consisting of the X1 group and the X2 group.

The photosensitive composition may contain a coloring agent. The rib member 13 obtained using the photosensitive composition containing a coloring agent can be used as, for example, a light-shielding partition wall for suppressing flare and ghost. Thus, by using a photosensitive composition containing a coloring agent, generation of optical noise can be further suppressed.

Examples of the coloring agent include organic pigments, inorganic pigments, and dyes. From the viewpoint of heat resistance and colorability, it is preferable to use a pigment as the coloring agent. When a black colored pattern such as a partition wall having a light shielding property is formed, it is preferable to use a black pigment as the coloring agent. Examples of the colored pattern other than a black pattern include a red pattern, a yellow pattern, and a blue pattern. The arithmetic mean roughness Ra of the inner peripheral surface 13*a* of the rib member 13 can also be adjusted by changing the particle size of the pigment.

The pigment is preferably one that generally absorbs light in a visible wavelength range. Examples of pigment that generally absorbs light in a visible wavelength range include black organic pigments such as anthraquinone-based black pigments, perylene-based black pigments, azo-based black pigments and lactam-based black pigments. Among them, perylene-based black pigments and lactam-based black pigments are preferable because they are excellent in light shielding property. Examples of the black inorganic pigment include carbon black and black titanium sub-oxynitride. Examples of other inorganic pigments include composite metal oxide pigments, titanium oxide, barium sulfate, lead sulfate, lead yellow, red iron oxide, ultramarine blue, iron blue, chromium oxide, antimony white, zinc sulfide, zinc, manganese purple, cobalt purple, and magnesium carbonate. Examples of the dye include azo-based compounds, anthraquinone-based compounds, perylene-based compounds, perinone-based compounds, phthalocyanine-based compounds, carbonium-based compounds, and indigoid-based compounds.

Examples of the pigment that is used for obtaining a colored pattern other than a black pattern include chromatic pigments such as red, orange, yellow, green, blue, purple, cyanine, and magenta pigments. The chromatic pigment is preferably a lactam-based pigment or a perylene-based pigment.

Specific examples of the chromatic pigment include Color Index (C.I.) Pigment Yellows 1, 10, 83, etc.; C.I. Pigment Oranges 2, 5, 13, etc.; C.I. Pigment Reds 1, 2, 3, etc.; C.I. Pigment Greens 7, 10, 36, etc.; and C.I. Pigment Blues 1, 2, 15, etc. These pigments can be used alone, or used in various combinations.

For further suppressing generation of optical noise, the coloring agent is preferably a black pigment (specifically, a black organic pigment or the like) or a blue pigment (specifically, a blue organic pigment or the like), more preferably a black pigment.

For obtaining a photosensitive composition which is excellent in photopolymerizability while further suppressing generation of residues after development, and generation of optical noise, the amount of the coloring agent is preferably 0.1 parts by weight or more and 10 parts by weight or less, more preferably 0.3 parts by weight or more and 7 parts by weight or less, still more preferably 0.3 parts by weight or more and 5 parts by weight or less, based on 100 parts by weight of the curable compound.

For forming the rib member 13 which is excellent in heat resistance, it is preferable that the photosensitive composition contains a polysiloxane compound. Hereinafter, preferred examples of the photosensitive composition containing a polysiloxane compound will be described.

The photosensitive composition that is preferable as a material for the rib member 13 (hereinafter, sometimes referred to as a "specific photosensitive composition") contains a polysiloxane compound having a cationically polymerizable group and an alkali-soluble group in one molecule (hereinafter, sometimes referred to as "component (A)"), and a photopolymerization initiator (hereinafter, sometimes referred to as "component (B)"). The component (A) is an example of a curable compound having a polymerizable group.

{Component (A)}

The component (A) is not particularly limited as long as it is a polysiloxane compound having a cationically polymerizable group and an alkali-soluble group in one molecule. When the component (A) has a cationically polymerizable group and an alkali-soluble group in one molecule, a specific photosensitive composition excellent in both developability and curability can be obtained. Preferably, the component (A) has a plurality of cationically polymerizable groups in one molecule. When the component (A) has a plurality of cationically polymerizable groups in one molecule, there is a tendency that the rib member 13 having a high crosslinking density is obtained, resulting in further improvement of the heat resistance of the rib member 13. A plurality of cationically polymerizable groups may be the same, or two or more different functional groups. Preferably, the component (A) has a plurality of alkali-soluble groups in one molecule. When the component (A) has a plurality of alkali-soluble groups in one molecule, developability tends to be further improved because non-exposed portion removability is enhanced during development. A plurality of alkali-soluble groups may be the same, or two or more different functional groups.

The component (A) may have a chain polysiloxane structure or a cyclic polysiloxane structure. For forming the rib member 13 having further excellent heat resistance, it is preferable that the component (A) has a cyclic polysiloxane structure. When the component (A) has a cyclic polysiloxane structure, the specific photosensitive composition tends to have high film formability and developability.

The component (A) may have a polysiloxane structure in the main chain or a polysiloxane structure in the side chain. For forming the rib member 13 having further excellent heat resistance, it is preferable that the component (A) has a polysiloxane structure in the main chain. For forming the rib member 13 having furthermore excellent heat resistance, it is preferable that the component (A) has a cyclic polysiloxane structure in the main chain.

The cyclic polysiloxane structure may be a monocyclic structure or a polycyclic structure. The polycyclic structure may be a polyhedral structure.

When the component (A) is a polymer having a polysiloxane structure in the main chain, the weight average molecular weight of the polymer is preferably 10,000 or more and 50,000 or less. When the weight average molecular weight is 10,000 or more, the heat resistance of the obtained rib member 13 tends to be further improved. On the other hand, when the weight average molecular weight is 50,000 or less, developability tends to be further improved.

Examples of the cationically polymerizable group of the component (A) include an epoxy group, a glycidyl group, a vinyl ether group, an oxetanyl group, and an alkoxysilyl group. From the viewpoint of the storage stability of the specific photosensitive composition, the cationically polymerizable group is preferably one or more selected from the group consisting of a glycidyl group, an alicyclic epoxy group and an oxetanyl group, more preferably one or more selected from the group consisting of a glycidyl group and an alicyclic epoxy group. Among them, an alicyclic epoxy group is particularly preferable because it is excellent in photocationic polymerizability.

Examples of the alkali-soluble group of the component (A) include an X1 group, an X2 group, a phenolic hydroxyl group, and a carboxy group. For forming the rib member 13 having excellent heat resistance, the alkali-soluble group of the component (A) is preferably one or more selected from the group consisting of the X1 group and the X2 group.

The method for introducing the cationically polymerizable group into the polysiloxane compound is not particularly limited, and a method using a hydrosilylation reaction is preferable because a cationically polymerizable group can be introduced into a polysiloxane compound via a chemically stable silicon-carbon bond (Si—C bond). In other words, the component (A) is preferably a polysiloxane compound which is organically modified by a hydrosilylation reaction and into which a cationically polymerizable group is introduced via a silicon-carbon bond. Preferably, the alkali-soluble group is also introduced into the polysiloxane compound via a silicon-carbon bond by a hydrosilylation reaction.

The component (A) is obtained by, for example, a hydrosilylation reaction using the following compounds (α), (β), and (γ) as starting substances.

Compound (α): a polysiloxane compound having at least two SiH groups (hydrosilyl groups) in one molecule.

Compound (β): a compound having a carbon-carbon double bond having reactivity with SiH group and a cationically polymerizable group in one molecule.

Compound (γ): a compound having a carbon-carbon double bond having reactivity with a SiH group and an alkali-soluble group in one molecule.

(Compound (α))

The compound (α) is a polysiloxane compound having at least two SiH groups in one molecule, and it is possible to used, for example, a compound disclosed in WO 96/15194, which has at least two SiH groups in one molecule. Specific examples of the compound (α) include hydrosilyl group-containing polysiloxanes having a linear structure, polysiloxanes having a hydrosilyl group at a molecular terminal, and a cyclic polysiloxanes containing a hydrosilyl group (hereinafter, sometimes referred to simply as "cyclic polysiloxane"). The cyclic polysiloxane may have a polycyclic structure, and the polycyclic structure may be a polyhedral structure. For forming the rib member 13 having high heat resistance and mechanical strength, it is preferable that a cyclic polysiloxane compound having at least two SiH groups in one molecule is used as the compound (α). The compound (α) is preferably a cyclic polysiloxane having three or more SiH groups in one molecule. From the viewpoint of heat resistance and light resistance, the group present on the Si atom is preferably a hydrogen atom or a methyl group.

Examples of the hydrosilyl group-containing polysiloxane having a linear structure include a copolymers of a dimethylsiloxane unit with a methylhydrogensiloxane unit and a terminal trimethylsiloxy unit, copolymers of a diphenylsiloxane unit with a methylhydrogensiloxane unit and a terminal trimethylsiloxy unit, copolymers of a methylphenylsiloxane unit with a methylhydrogensiloxane unit and a terminal trimethylsiloxy unit, and polysiloxanes terminally blocked with a dimethylhydrogensilyl group.

Examples of the polysiloxane having a hydrosilyl group at a molecular terminal include polysiloxanes terminally blocked with a dimethylhydrogensilyl group, and polysiloxanes including a dimethylhydrogensiloxane unit ($H(CH_3)_2SiO_{1/2}$ unit) and one or more siloxane units selected from the group consisting of a $SiO_2$ unit, a $SiO_{3/2}$ unit and a SiO unit.

Examples of the cyclic polysiloxane include 1,3,5,7-tetrahydrogen-1,3,5,7-tetramethylcyclotetrasiloxane, 1-propyl-3,5,7-trihydrogen-1,3,5,7-tetramethylcyclotetrasiloxane, 1,5-dihydrogen-3,7-dihexyl-1,3,5,7-tetramethylcyclotetrasiloxane, 1,3,5-trihydrogen-1,3,5-trimethylcyclotrisiloxane, 1,3,5,7,9-pentahydrogen-1,3,5,7, 9-pentamethylcyclopentasiloxane, and 1,3,5,7,9,11-hexahydrogen-1,3,5,7,9,11-hexamethylcyclohexasiloxane. Among them, 1,3,5,7-tetrahydrogen-1,3,5,7-tetramethylcyclotetrasiloxane is preferable from the viewpoint of availability, and reactivity of the SiH group.

The compound (α) is obtained by a known synthesis method. The cyclic polysiloxane can be synthesized by, for example, a method disclosed in WO 96/15194 A or the like. The cyclic polysiloxane having a polyhedral backbone can be synthesized by, for example, a method described in Japanese Patent Laid-Open Publication No. 2004-359933, Japanese Patent Laid-Open Publication No. 2004-143449, Japanese Patent Application Laid-Open Publication No. 2006-269402, or the like. As the compound (α), a commercially available polysiloxane compound may be used.

(Compound (β))

The compound (β) has a carbon-carbon double bond having reactivity with a SiH group (hydrosilyl group) and a cationically polymerizable group in one molecule, and is used for introducing a cationically polymerizable group into a polysiloxane compound. The cationically polymerizable group in the compound (β), together with its preferred aspects, is the same as described above for the cationically polymerizable group of the component (A). That is, the compound (β) has preferably one or more selected from the group consisting of a glycidyl group, an alicyclic epoxy group and an oxetanyl group, more preferably one or more selected from the group consisting of a glycidyl group and an alicyclic epoxy group, still more preferably has an alicyclic epoxy group, as the cationically polymerizable group.

Examples of the group containing a carbon-carbon double bond having reactivity with a SiH group (hereinafter, sometimes referred to simply as an "alkenyl group") include a vinyl group, an allyl group, a methallyl group, and an allyloxy group ($—O—CH_2—CH—CH_2$). From the viewpoint of reactivity with a SiH group, the compound (β) has preferably one or more selected from the group consisting of a vinyl group, an allyl group and an allyloxy group, more preferably one or more selected from the group consisting of a vinyl group and an allyl group, as the alkenyl group.

Specific examples of the compound (β) include 1-vinyl-3,4-epoxycyclohexane, allyl glycidyl ether, allyl oxetanyl ether, diallyl monoglycidyl isocyanurate, and monoallyl diglycidyl isocyanurate. From the viewpoint of reactivity in cationic polymerization, the compound (β) is preferably a compound having one or more functional groups selected from the group consisting of an alicyclic epoxy group and a glycidyl group, more preferably a compound having an alicyclic epoxy group. For further enhancing the reactivity in cationic polymerization, the compound (β) is preferably one or more compounds selected from the group consisting of diallyl monoglycidyl isocyanurate and 1-vinyl-3,4-epoxycyclohexane, more preferably 1-vinyl-3,4-epoxycyclohexane.

(Compound (γ))

The compound (γ) has a carbon-carbon double bond having reactivity with a SiH group and an alkali-soluble group in one molecule, and is used for introducing an alkali-soluble group into a polysiloxane compound. The alkali-soluble group in the compound (γ), together with its preferred aspects, is the same as described above for the alkali-soluble group of the component (A). That is, it is preferable that the compound (γ) preferably has one or more selected from the group consisting of an X1 group and an X2 group as the alkali-soluble group.

The compound (γ) has a group containing a carbon-carbon double bond having reactivity with a SiH group (alkenyl group). Examples of the alkenyl group of the compound (γ), together with its preferred aspects, include those exemplified above for the alkenyl group of the compound (β). That is, the compound (γ) has preferably one or more selected from the group consisting of a vinyl group, an allyl group and an allyloxy group, more preferably one or more selected from the group consisting of a vinyl group and an allyl group, as the alkenyl group.

For obtaining a specific photosensitive composition which is excellent in developability, the compound (γ) is preferably one or more selected from the group consisting of diallyl isocyanurate, monoallyl isocyanurate and 2,2'-diallyl bisphenol A, more preferably one or more selected from the group consisting of diallyl isocyanurate and monoallyl isocyanurate. When monoallyl isocyanurate is used as the compound (γ), a component (A) having the X1 group as an alkali-soluble group is obtained. When diallyl isocyanurate is used as the compound (γ), a component (A) having the X2 group as an alkali-soluble group is obtained.

(Other Starting Substances)

In addition to the compound (α), compound (β) and compound (γ), other starting substances may be used in the hydrosilylation reaction. For example, an alkenyl group-containing compound which is different from the compound (β) and compound (γ) (hereinafter, sometimes referred to as "another alkenyl group-containing compound") may be used as the other starting substance.

For adjusting the skewness Ssk of the inner peripheral surface 13*a* of the rib member 13 to a negative value by forming a phase separation structure-derived irregularities on the inner peripheral surface 13*a*, it is preferable that a linear polysiloxane compound having an alkenyl group at both ends (hereinafter, sometimes referred to as a "compound (δ)") is used as another alkenyl group-containing compound, and cyclic polysiloxane is used as the compound (α). When the compound (δ) is used, a polysiloxane compound having a linear structure is obtained as the component (A). When cyclic polysiloxane is used as the compound (α), and the compound (δ) is used, a specific photosensitive composition having a linear structure and a cyclic structure is obtained. That is, when cyclic polysiloxane is used as the compound (α), and the compound (δ) is used, a linear structure part (compound (δ)-derived linear structure part) and a cyclic structure part (cyclic polysiloxane-derived cyclic structure part) are introduced into the component (A). Specific examples of the compound (δ) include compounds represented by the following general formula Y.

General Formula Y (Y)

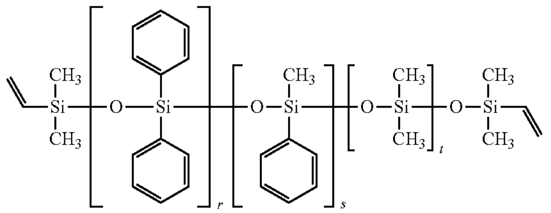

In the general formula Y, the ratio of r, s and t (r:s:t) is a substance amount ratio of the structural units. For example, r+s+t=100. In the general formula Y, the arrangement of the structural units is not particularly limited.

For further suppressing generation of optical noise, the weight average molecular weight of the compound (δ) is preferably 1,000 or more and 30,000 or less, and more preferably 2,000 or more and 29,000 or less.

For further suppressing generation of optical noise, the content of the structural unit derived from the compound (δ) in the component (A) is preferably 1.0 wt % or more and 10.0 wt % or less, more preferably 1.2 wt % or more and 5.0 wt % or less, based on 100 wt % of the component (A).

The arithmetic mean roughness Ra of the inner peripheral surface 13*a* of the rib member 13 and the skewness Ssk of the inner peripheral surface 13*a* of the rib member 13 can be each adjusted by, for example, changing at least one of the content of compound (δ)-derived structural units in the component (A) and the weight average molecular weight of the compound (δ).

(Hydrosilylation Reaction)

The order and the method of the hydrosilylation reaction for obtaining the component (A) are not particularly limited. For example, the component (A) is obtained by a hydrosilylation reaction conforming to a method disclosed in WO 2009/075233 and using the compound (α), the compound (β), the compound (γ), and other starting substances as optional components if necessary. The component (A) obtained using the compound (α), the compound (β), the compound (γ), and other starting substances as optional components if necessary is, for example, a polymer having a plurality of cationically polymerizable groups and a plurality of alkali-soluble groups in one molecule, and a polysiloxane structure in the main chain.

For further suppressing generation of optical noise, the content of the component (A) in the specific photosensitive composition is preferably 20 wt % or more and 97 wt % or less based on the total solid content of the specific photosensitive composition.

{Component (B)}

The component (B) is preferably one or more selected from the group consisting of a photocationic polymerization initiator and a photoradical polymerization initiator. Since the specific photosensitive composition contains the component (A) having a cationically polymerizable group, the component (A) can be crosslinked by photocationic polymerization when the specific photosensitive composition contains a photocationic polymerization initiator as the component (B). When a component (C) described later is used, the component (C) can be crosslinked by photoradical polymerization when the specific photosensitive composition contains a photoradical polymerization initiator as the component (B). The specific photosensitive composition may contain both a photocationic polymerization initiator and a photoradical polymerization initiator as the component (B).

(Photocationic Polymerization Initiator)

As the photocationic polymerization initiator, for example, a known photocationic polymerization initiator can be used. The photocationic polymerization initiator is not particularly limited, and examples thereof include various compounds which are considered suitable in Japanese Patent Laid-open Publication No. 2000-1648, National Publication of International Patent Application No. 2001-515533, and WO 2002/83764. The photocationic polymerization initiator is preferably a sulfonate ester-based compound, a carboxylic acid ester-based compound, or an onium salt-based compound, more preferably an onium salt-based compound, still more preferably a sulfonium salt-based compound.

The content ratio of the photocationic polymerization initiator in the specific photosensitive composition is not particularly limited. From the viewpoint of the balance between the curing rate and the physical properties of the cured product, the content ratio of photocationic polymerization initiator is preferably 0.1 wt % or more and 10 wt % or less, more preferably 0.3 wt % or more and 5 wt % or less, based on the total solid content of the specific photosensitive composition.

(Photoradical Polymerization Initiator)

Examples of the photoradical polymerization initiator include acetophenone-based compounds, acylphosphine oxide-based compounds, benzoin-based compounds, benzophenone-based compounds, α-diketone-based compounds, biimidazole-based compounds, polynuclear quinone-based compounds, triazine-based compounds, oxime ester-based compounds, titanocene-based compounds, xanthone-based compounds, thioxanthone-based compounds, ketal-based compounds, azo-based compounds, peroxides, 2,3-dialkyldione-based compounds, disulfide-based compounds, and fluoroamine-based compounds. From the viewpoint of ease of patterning, the photoradical polymerization initiator is preferably one or more selected from the group consisting of an acetophenone-based compound, a benzophenone-based compound, and an oxime ester-based compound, more preferably a benzophenone-based compound.

Examples of the benzophenone-based compound include benzyl dimethyl ketone, benzophenone, 4,4'-bis(dimethylamino)benzophenone, and 4,4'-bis(diethylamino)benzophenone.

The content ratio of the photoradical polymerization initiator in the specific photosensitive composition is not particularly limited. From the viewpoint of the balance between the curing rate and the physical properties of the cured product, the content ratio of photoradical polymerization initiator is preferably 0.1 wt % or more and 5 wt % or less, more preferably 0.3 wt % or more and 1 wt % or less, based on the total solid content of the specific photosensitive composition.

{Solvent}

The specific photosensitive composition may contain a solvent. For example, the component (A), the component (B), and other components used if necessary as described later are dissolved or dispersed in a solvent to obtain a specific photosensitive composition.

Specific examples of the solvent include hydrocarbon-based solvents such as benzene; ether-based solvents such as tetrahydrofuran; ketone-based solvents such as acetone; glycol-based solvents such as propylene glycol 1-monomethyl ether 2-acetate; ester-based solvents such as isobutyl isobutyrate; and halogen-based solvents such as chloroform. From the viewpoint of the applicability (film formation stability) of the specific photosensitive composition, the solvent is preferably a glycol-based solvent, more preferably propylene glycol 1-monomethyl ether 2-acetate.

From the viewpoint of applicability (film formation stability) of the specific photosensitive composition, the amount of the solvent is preferably 0.5 parts by weight or more and 100 parts by weight or less, more preferably 1 part by weight or more and 70 parts by weight or less, based on 100 parts by weight of the component (A).

{Other Components}

The specific photosensitive composition may contain components other than the above-described component (A) and component (B) (other components) as a solid content (components other than the solvent) as long as the purpose and the effects of the present invention are not impaired.

However, for forming the rib member 13 which is excellent in heat resistance while enabling further suppression of generation of optical noise, the total content of the component (A) and the component (B) is preferably 50 wt % or more, more preferably 60 wt % or more, still more preferably 70 wt % or more and 100 wt % or less, based on the total solid content of the specific photosensitive composition.

Examples of the other component include a compound having a radically polymerizable group (radically polymerizable compound), a coloring agent (specifically, one identical to the compound described above as an example of the coloring agent), a reactive diluent, a sensitizer, a polymer dispersant, a thermoplastic resin, a filler, a crosslinker, a basic compound, an adhesiveness improver, a coupling agent (silane coupling agent or the like), an antioxidant, a radical scavenger, a mold release agent, a flame retardant, a flame retardant promoter, a surfactant, an antifoaming agent, an emulsifier, a leveling agent, a cissing inhibitor, an ion trapping agent (antimony-bismuth or the like), a thixotropy imparting agent, a tackifier, a storage stability improver, an ozone degradation inhibitor, a light stabilizer, a thickener, a plasticizer, a heat stabilizer, a conductivity imparting agent, an antistatic agent, a radiation blocking agent, a nucleating agent, a phosphorus-based peroxide decomposer, a lubricant, a metal deactivator, a thermal conductivity imparting agent, and a physical property modifier.

(Compound Having Radically Polymerizable Group)

The specific photosensitive composition may contain a compound having a radically polymerizable group (hereinafter, sometimes referred to as a "component (C)") as the other component. Since the component (C) is the other component (a component other than the component (A) and the component (B)), the component (C) has a radically polymerizable group and does not have a siloxane unit. The specific photosensitive composition containing the component (C) tends to be excellent in deep-curing (property of being photocrosslinkable even at a deep part) in patterning.

Examples of the component (C) include compounds having a radically polymerizable unsaturated bond (ethylenically unsaturated bond or the like). Examples of the group containing the ethylenically unsaturated bond include a (meth)acryloyl group and a vinyl group.

Specific examples of the component (C) include allyl (meth)acrylate, vinyl (meth)acrylate, dicyclopentenyl (meth)acrylate, dicyclopentenyloxyethyl (meth)acrylate, trimethylolpropane tri(meth)acrylate, pentaerythritol tetra (meth)acrylate, ditrimethylolpropane tetra(meth)acrylate, dipentaerythritol hexa(meth)acrylate, butanediol di(meth) acrylate, nonanediol di(meth)acrylate, polypropylene glycol (meth)acrylate, bisphenol A di(meth)acrylate, and tris(2-(meth)acryloyloxyethyl)isocyanurate.

For obtaining an optical semiconductor device which further suppresses generation of optical noise and is excellent in reliability, the content of the component (C) in the specific photosensitive composition is preferably 1 wt % or more and 50 wt % or less, more preferably 5 wt % or more and 40 wt % or less, still more preferably 10 wt % or more and 30 wt % or less, based on the total solid content of the specific photosensitive composition.

As the photosensitive composition which is a material for the rib member 13, not only the specific photosensitive composition, but also a photosensitive composition containing a cationically polymerizable compound other than the component (A) can be used. It is also possible to use a specific photosensitive composition containing the component (A) and a cationically polymerizable compound other than the component (A). Examples of the cationically polymerizable compound other than the component (A) include bisphenol A type epoxy resins, hydrogenated bisphenol A type epoxy resins, novolac phenol type epoxy resins, biphenyl type epoxy resins, dicyclopentadiene type epoxy resins, bisphenol F diglycidyl ether, bisphenol A diglycidyl ether, 3',4'-epoxycyclohexylmethyl 3,4-epoxycyclohexane carboxylate ("CELLOXIDE (registered trademark) 2021P" manufactured by DAICEL CORPORATION), and ε-caprolactone-modified 3',4'-epoxycyclohexylmethyl 3,4-epoxycyclohexane carboxylate ("CELLOXIDE (registered trademark) 2081" manufactured by DAICEL CORPORATION).

When the component (A) and a cationically polymerizable compound (curable compound) other than the component (A) are used in combination, the amount of the cationically polymerizable compound other than the component (A) is preferably 1 part by weight or more and 10 parts by weight or less, more preferably 3 parts by weight or more and 8 parts by weight or less, based on 100 parts by weight of the component (A) for forming the rib member 13 which is excellent in heat resistance while improving storage stability of the specific photosensitive composition.

[Preferred Aspect of Optical Semiconductor Device]

For obtaining an optical semiconductor device which is further excellent in reliability evaluated in a thermal shock test while further suppressing generation of optical noise, the optical semiconductor device according to the present invention preferably satisfies the following condition 1, more preferably satisfies the following condition 2, still more preferably satisfies the following condition 3, and even more preferably satisfies the following condition 4.

Condition 1: The end surface coverage ratio is 60% or more and 99% or less.

Condition 2: Condition 1 is satisfied, and the arithmetic mean roughness Ra of the inner peripheral surface of the rib member is 50 nm or more and 3,000 nm or less.

Condition 3: The above condition 2 is satisfied, and the skewness Ssk of the inner peripheral surface of the rib member is a negative value.

Condition 4: Condition 3 is satisfied, and the skewness Ssk of the inner peripheral surface of the rib member is −0.80 or more and −0.10 or less.

[Method for Manufacturing Optical Semiconductor Device]

Next, a suitable method for manufacturing the optical semiconductor device 10 will be described with reference to FIGS. 6A to 6C and FIGS. 7A to 7C.

Figure 6A:
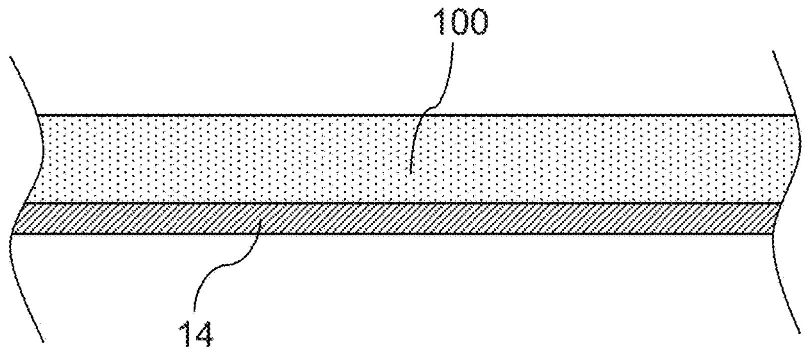
FIGS. 6A, 6B, and 6C are step-by-step sectional views showing a method for manufacturing an example of an optical semiconductor device according to the present invention.

First, a photosensitive composition is applied onto the large-sized transparent substrate 14 to form a coating film 100 formed of the photosensitive composition (FIG. 6A). The method for application here is not particularly limited, and for example, a general application method such as a spin coating method, or a slit coating method can be used. Subsequently, the coating film 100 is heated to remove the solvent in the coating film 100. The temperature for heating the coating film 100 can be appropriately set, and is preferably 60 °C or higher and 200 °C or lower.

Figure 6B:
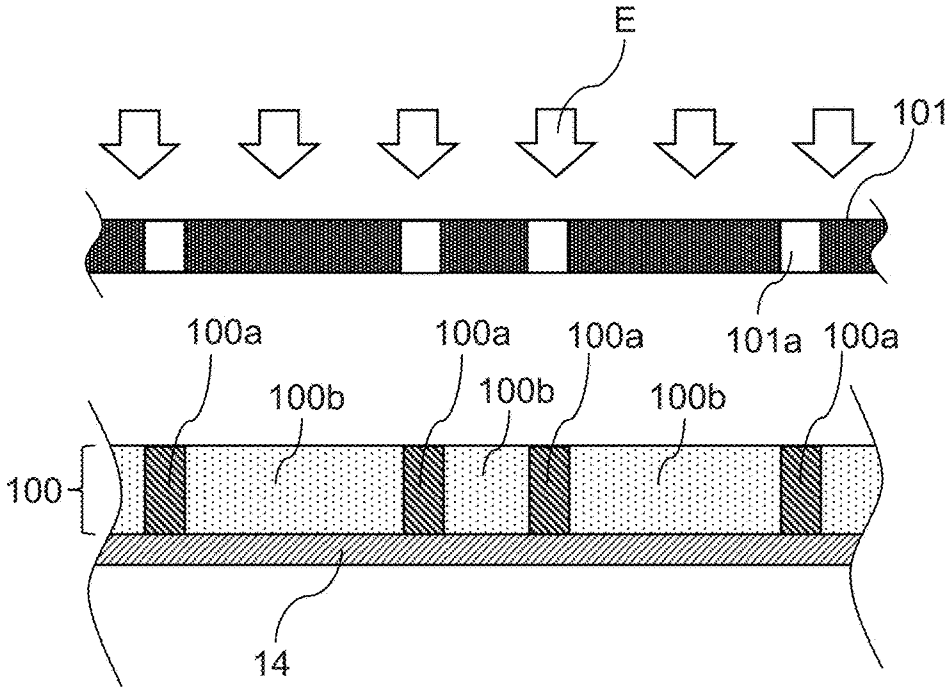

Subsequently, a photomask 101 having a light-transmitting region **101*a* formed at a predetermined position is disposed on the coating film 100, and the coating film 100 is irradiated with an active energy ray E (FIG. 6B). In this way, only the coating film 100 (exposed portion 100*a*) located below the light-transmitting region 101*a* is exposed, and undergoes a photocuring reaction. The integrated exposure amount during exposure is not particularly limited, and is preferably 1 $mJ/cm^2$ or more and 20,000 $mJ/cm^2$ or less, more preferably 10 $mJ/cm^2$ or more and 10,000 $mJ/cm^2$ or less. The time of irradiation of the coating film 100** with the active energy ray E is preferably 1 second or more and 600 seconds or less, more preferably 1 second or more and 150 seconds or less.

Figure 6C:
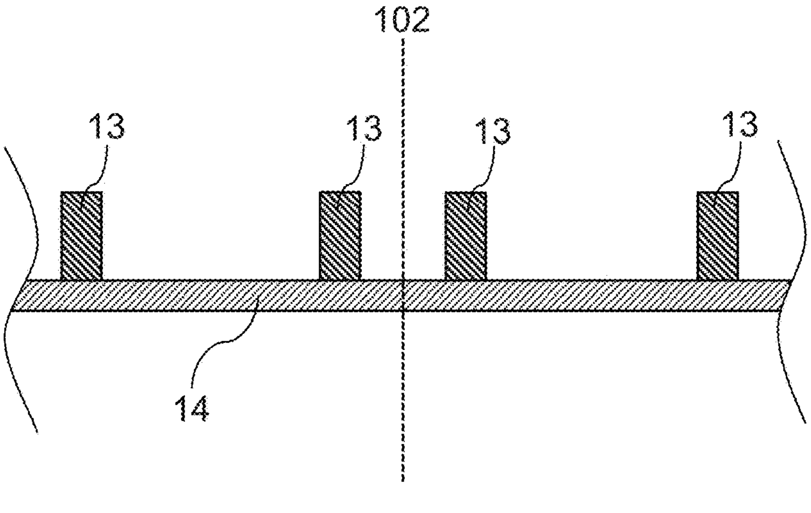

Subsequently, the exposed coating film 100 is developed. The method for developing the coating film 100 is not particularly limited. For example, an alkaline developer is brought into contact with the coating film 100 by an immersion method or a spraying method to dissolve and remove a non-exposed portion 100*b*, thereby forming the patterned semi-cured rib member 13 on the transparent substrate 14 (FIG. 6C). The alkaline developer is not particularly limited, and may be one that is commonly used. Specific examples of the alkaline developer include organic alkali aqueous solutions such as a tetramethylammonium hydroxide (TMAH) aqueous solution or a choline aqueous solution; and inorganic alkali aqueous solutions such as a potassium hydroxide aqueous solution, a sodium hydroxide aqueous solution, a potassium carbonate aqueous solution, a sodium carbonate aqueous solution, and a lithium carbonate aqueous solution. From the viewpoint of increasing the contrast between the exposed portion 100*a* and the non-exposed portion 100*b*, the alkali concentration is preferably 25 wt % or less, more preferably 10 wt % or less, still more preferably 5 wt % or less. For the purpose of, for example, adjusting the dissolution rate, an alcohol or a surfactant may be blended in the alkaline developer. The coating film 100 may be washed with water after the coating film 100 is brought into contact with the alkaline developer. When the coating film 100 is washed with water, it is preferable to remove moisture on the surface of the coating film 100 with compressed air after washing with water.

Subsequently, the rib member 13 formed in a semi-cured state on the transparent substrate 14 is heated to further cure the semi-cured photosensitive composition. The heating temperature here is preferably 80 °C. or higher and 350 °C. or lower, more preferably 150 °C. or higher and 250 °C. or lower. Subsequently, the transparent substrate 14 on which a plurality of rib members 13 are formed is diced along a division line 102 in FIG. 6C so as to singulate the transparent substrate 14 between the rib members 13. Hereinafter, a laminate (specifically, a transparent substrate on which one rib member is formed) obtained by singulating a transparent substrate on which a plurality of rib members are formed may be referred to as a "ribbed substrate."

Figure 7A:
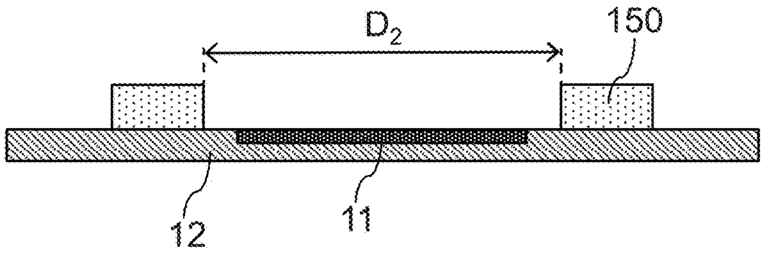
FIGS. 7A, 7B, and 7C are step-by-step sectional views showing a method for manufacturing an example of an optical semiconductor device according to the present invention.

Subsequently, on the semiconductor substrate 12 provided with the light-receiving element 11, an adhesive is applied so as to surround the light-receiving element 11, and a frame-shaped coated film 150 including an adhesive is formed (FIG. 7A). The method for applying an adhesive is not particularly limited, and may be a method of application by a dispenser, a method of application by a syringe, a screen printing method, a stamping method, or the like. For improving the application accuracy, a method of application by a dispenser is preferable. For further improving the application accuracy, the adhesive may be applied by using an application robot and a dispenser in combination.

When the adhesive is applied by a dispenser, an air pulse type dispenser or a Mohno type dispenser can be used. When the adhesive is applied by a dispenser, the amount of application of the adhesive and the width of the coated film 150 can be adjusted by changing the outer diameter of a nozzle, the interval between the nozzle and the semiconductor substrate 12, or the like. When an air pulse type dispenser is used, the amount of application of the adhesive can also be adjusted by changing the air pressure. When a Mohno type dispenser is used, the amount of application of the adhesive can be adjusted by changing the rotation speed of a rotor.

In application of the adhesive, it is preferable to adjust a coating diameter $D_2$ of the coated film 150 (the inner periphery diameter of the coated film 150) so that an interval between an inner peripheral surface and a center line as described later meets a target value.

Figure 7B:
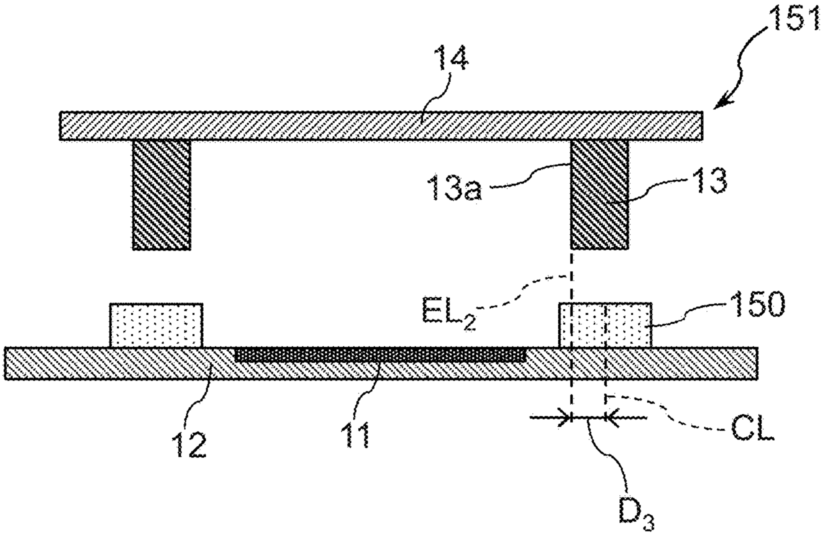

Subsequently, using, for example, flip chip bonder, a ribbed substrate 151 obtained by the above-described procedure is moved above the semiconductor substrate 12 on which the coated film 150 is formed (FIG. 7B). Here, the ribbed substrate 151 and the semiconductor substrate 12 are aligned so that an interval $D_3$ between an extended line $EL_2$ of the inner peripheral surface 13*a* of the rib member 13 and a center line CL bisecting the coated film 150 in the width direction (see FIG. 7B) meets a target value. Hereinafter, the interval between the extended line of the inner peripheral surface of the rib member and the center line bisecting the coated film in the width direction is sometimes referred to as an "inner peripheral surface-center line interval."

Figure 7C:
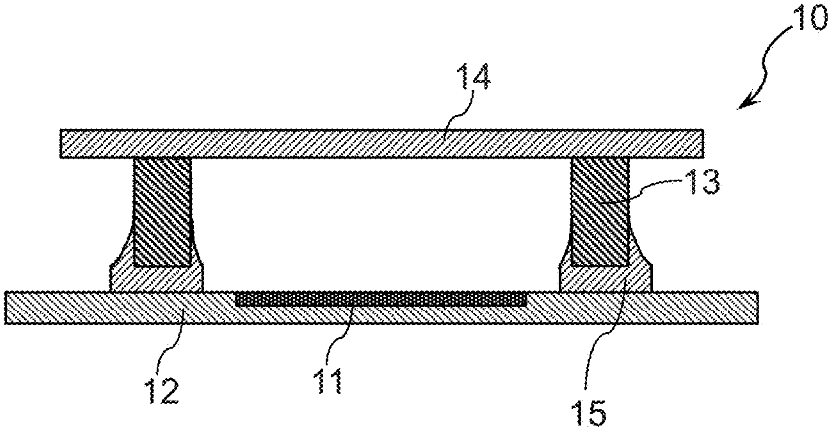

Subsequently, the rib member 13 is brought into contact with the coated film 150 to bond the ribbed substrate 151 and the semiconductor substrate 12 to each other with the coated film 150 interposed therebetween, and the coated film 150 is then cured. In this way, the adhesive layer 15 (see FIG. 7C) for bonding the rib member 13 and semiconductor substrate 12 is formed. The method for curing the coated film 150 may be appropriately selected according to the type of the adhesive forming the coated film 150. Specific examples of the method for curing the coated film 150 include a method of curing by heating, a method of curing by ultraviolet irradiation, a method of curing by heating and ultraviolet irradiation in combination. The optical semiconductor device 10 shown in FIG. 7C is obtained through the above-described procedure.

The length of protrusion, the inner periphery coverage ratio, the outer periphery coverage ratio and the end surface coverage ratio can be adjusted by, for example, changing at least one of the viscosity of the adhesive, the particle size of the gap spacer blended in the adhesive, the content of the gap spacer blended in the adhesive, the inner periphery-center line interval, the outer diameter of the nozzle, the interval between the nozzle and the semiconductor substrate, the air pressure, and the rotation speed of the rotor.

EXAMPLES

Examples of the present invention will be described below, but the present invention is not limited to the examples.

<Synthesis of Curable Compound (Polysiloxane Compound)>

Hereinafter, methods for synthesis of curable compounds P1 and P2 will be described. The weight average molecular weights of curable compounds P1 and P2 were calculated in terms of standard polystyrene from a chromatogram obtained by measuring the weight average molecular weight at a flow rate of 1.0 mL/min using "HLC-8420 GPC" (Column: Shodex GPC KD-806 M (2 columns) and TSKgel SuperAWM-H (2 columns)) manufactured by Tosoh Corporation, and N,N-dimethylformamide as a solvent.

[Synthesis of Curable Compound P1]

143 μL of a xylene solution of a platinum vinyl siloxane complex ("Pt-VTSC-3X" manufactured by Umicore Precious Metals Japan Co., Ltd., solution with a platinum content of 3 wt %) was added to a mixture of 40 g of diallyl isocyanurate, 29 g of diallyl monomethyl isocyanurate and 264 g of 1,4-dioxane to obtain a solution S1. Meanwhile, 88 g of 1,3,5,7-tetrahydrogen-1,3,5,7-tetramethylcyclotetrasiloxane was dissolved in 176 g of toluene to obtain a solution S2.

In a nitrogen atmosphere containing 3 vol % of oxygen, the solution S1 was added dropwise to the solution S2 over 3 hours with the solution S2 heated at a temperature of 105 °C. After completion of the dropwise addition, the mixture was stirred for 30 minutes while being maintained at a temperature of 105 °C., thereby obtaining a solution S3. The reaction ratio of the alkenyl group of the compound contained in the obtained solution S3 was measured by $^1$H-NMR, and the result showed that the reaction ratio was 95% or more.

Meanwhile, 62 g of 1-vinyl-3,4-epoxycyclohexane was dissolved in 62 g of toluene to obtain a solution S4.

In a nitrogen atmosphere containing 3 vol % of oxygen, the solution S4 was added dropwise to the solution S3 over 1 hour with the solution S3 heated at a temperature of 105 °C. After completion of the dropwise addition, the mixture was stirred for 30 minutes while being maintained at a temperature of 105 °C., thereby obtaining a solution S5. The reaction ratio of the alkenyl group of the compound contained in the obtained solution S5 was measured by $^1$H-NMR, and the result showed that the reaction ratio was 95% or more.

Subsequently, the solution S5 was cooled, and the solvent (toluene, xylene, and 1,4-dioxane) was then distilled off from the solution S5 under reduced pressure to obtain a solid. Propylene glycol 1-monomethyl ether 2-acetate (hereinafter, referred to as "PGMEA") was added to the obtained solid to obtain a solution SP1 containing the curable compound P1 (concentration of the curable compound P1: 70 wt %). The curable compound P1 was a polysiloxane compound having a plurality of cationically polymerizable groups (specifically, alicyclic epoxy groups) and a plurality of alkali-soluble groups (specifically, X2 groups) in one molecule, and a cyclic polysiloxane structure in the main chain (a polymer having a weight average molecular weight of 30,000).

[Synthesis of Curable Compound P2]

A solution SP2 containing a curable compound P2 (concentration of curable compound P2: 70 wt %) was obtained by the same method as in [Synthesis of curable compound P1] except that 143 μL of a xylene solution of a platinum vinyl siloxane complex ("Pt-VTSC-3X" manufactured by Umicore Precious Metals Japan Co., Ltd., solution with a platinum content of 3 wt %) was added to a mixture of 40 g of diallyl isocyanurate, 29 g of diallyl monomethyl isocyanurate, 3.4 g of a linear polysiloxane compound and 264 g of 1,4-dioxane to obtain a solution S1. The linear polysiloxane compound was a compound represented by the general formula (Y) described above. In the linear polysiloxane compound, the substance amount ratio (Ratio of r, s and t) of each structural unit was r:s:t=30:0:70, and the weight average molecular weight was 26,000.

The curable compound P2 was a polysiloxane compound having a plurality of cationically polymerizable groups (specifically, alicyclic epoxy groups), a plurality of alkali-soluble groups (specifically, X2 groups) and a linear structure part (a linear structure part derived from the linear polysiloxane compound) in one molecule, and a cyclic polysiloxane structure in the main chain (a polymer having a weight average molecular weight of 30,000).

<Preparation of Other Materials>

As materials for photosensitive compositions, the following materials were prepared in addition to the solutions SP1 and SP2 and PGMEA.

- 3',4'-epoxycyclohexylmethyl 3,4-epoxycyclohexanecarboxylate ("CELLOXIDE (registered trademark) 2021P" manufactured by DAICEL CORPORATION, hereinafter referred to as "2021P")
- Ditrimethylolpropane tetraacrylate ("AD-TMP" manufactured by Shin-Nakamura Chemical Co., Ltd., a radical polymerizable compound having four acryloyl groups in one molecule, hereinafter referred to as "AD-TMP")
- Sulfonium salt-based photocationic polymerization initiator ("CPI-210S" manufactured by San-Apro Ltd, hereinafter referred to as "CPI-210S")
- Benzophenone-based compound as photoradical polymerization initiator ("Omnirad (registered trademark) 651" manufactured by IGM Resins, hereinafter referred to as "651")
- Black organic pigment ("NPFT-80565" manufactured by Nippon Pigment Company Limited)
- Blue organic pigment ("Pigment Blue 15" manufactured by Dainichiseika Color & Chemicals Mfg. Co., Ltd.)
- Yellow organic pigment ("Pigment Yellow 83" manufactured by Dainichiseika Color & Chemicals Mfg. Co., Ltd.)

<Preparation of Photosensitive Composition>

The materials shown in Table 1 were blended in the blending amounts shown in Table 1, thereby obtaining photosensitive compositions PS1 to PS5 used in examples and comparative examples. The curable compounds P1 and P2 were blended in the form of the solution SP1 and the solution SP2, respectively. In Table 1, the blending amount of PGMEA in the photosensitive compositions PS1 to PS5 also includes the amount of PGMEA in the solution SP1 or the solution SP2. In Table 1, "-" means that the relevant material was not blended.

TABLE 1

| Photosensitive composition | | PS1 | PS2 | PS3 | PS4 | PS5 |
|---|---|---|---|---|---|---|
| Blending amount of each material (unit: parts by weight) | P1 | 100 | — | 100 | 100 | 100 |
| | P2 | — | 100 | — | — | — |
| | 2021P | 5 | 5 | 5 | 5 | 5 |
| | AD-TMP | — | 30 | — | — | — |
| | CPI-210S | 1 | 0.5 | 1 | 1 | 1 |
| | 651 | — | 1 | — | — | — |
| | NPFT-80565 | — | — | 2 | — | — |
| | Pigment Blue 15 | — | — | — | 2 | — |
| | Pigment Yellow 83 | — | — | — | — | 2 |
| | PGMEA | 49 | 49 | 49 | 49 | 49 |

<Preparation of Adhesive>

[Preparation of Materials]

As materials for the adhesive, the following materials were provided.

- Bisphenol A type epoxy resin ("jER828" manufactured by Mitsubishi Chemical Corporation, hereinafter referred to as "828")
- CPI-210S
- Tripropylene glycol diacrylate ("TPGDA" manufactured by DAICEL CORPORATION, a radical polymerizable compound having two acryloyl groups in one molecule, hereinafter referred to as "TPGDA")

651

Rheology modifier ("AEROSIL (registered trademark) R972" manufactured by NIPPON AEROSIL CO., LTD., fumed silica particles surface-treated with dimethyldichlorosilane, particle size: 16 nm, hereinafter referred to as "R972")

Gap spacer having volume median diameter of 10 μm ("HIPRESICA (registered trademark) N3N" manufactured by UBE EXSYMO CO., LTD., high-purity monodisperse spherical silica particles, hereinafter referred to as "N3N-10")

Gap spacer having volume median diameter of 20 μm ("HIPRESICA (registered trademark) N3N" manufactured by UBE EXSYMO CO., LTD., high-purity monodisperse spherical silica particles, hereinafter referred to as "N3N-20")

[Mixing of Materials]

The materials shown in Table 2 were blended in the blending amounts shown in Table 2, and the obtained mixture was kneaded (kneaded three times) with a three-roll mill to obtain adhesives AD1 to AD7 for use in examples and comparative examples. In Table 2, "–" means that the relevant material was not blended. The "viscosity" in Table 2 is a viscosity indicated by a Brookfield type rotational viscometer 3 minutes after the start of measurement (rotation) using a Brookfield type rotational viscometer ("HBDV-I" manufactured by Brookfield Corporation) under the conditions of spindle: No. 3, measurement temperature: 25 °C. and rotation speed: 50 rpm.

TABLE 2

| Adhesive | | AD1 | AD2 | AD3 | AD4 | AD5 | AD6 | AD7 |
|---|---|---|---|---|---|---|---|---|
| Blending | 828 | 100 | 100 | 100 | 100 | 100 | 100 | — |
| amount | CPI-210S | 3 | 3 | 3 | 3 | 3 | 3 | — |
| of each | TPGDA | — | — | — | — | — | — | 100 |
| material | 651 | — | — | — | — | — | — | 3 |
| (unit: parts | R972 | 10 | 5 | 13 | 15 | 18 | 10 | 10 |
| by weight) | N3N-10 | 1 | 1 | 1 | 1 | 1 | — | 1 |
| | N3N-20 | — | — | — | — | — | 1 | — |
| Viscosity [Pa · s] | | 100 | 50 | 200 | 300 | 600 | 100 | 100 |

<Production of Optical Semiconductor Device>

Hereinafter, methods for producing optical semiconductor devices in Examples 1 to 16 and Comparative Examples 1 and 2 will be described.

Example 1

(Ribbed Substrate Producing Step)

A photosensitive composition PS1 was applied onto a glass substrate as a transparent substrate by a spin coater to obtain a first laminate in which a coating film formed of the photosensitive composition PS1 is formed on a glass substrate. Subsequently, the first laminate was heated for 10 minutes on a hot plate heated to a temperature of 120 °C. Subsequently, through a photomask 101 shown in FIG. 6B (photomask 101 having a light-transmitting region 101*a* having a width of 150 μm), the coating film of the heated first laminate was irradiated with light under the condition of an integrated exposure amount of 3,000 mJ/cm$^2$ using a manual exposure machine ("MA-1300" manufactured by Japan Science Engineering Co., Ltd., lamp: high-pressure mercury lamp). In this way, the coating film was exposed (specifically, soft contact exposure).

The exposed first laminate was allowed to stand in an atmosphere at a temperature of 25 °C. for 1 minute, and then immersed in a TMAH aqueous solution (concentration of TMAH: 2.38 wt %) as an alkaline developer for 60 seconds. Subsequently, the first laminate immersed in the alkaline developer was washed with water for 30 seconds, and moisture on the surface was removed with compressed air. In this way, a second laminate including a patterned coating film (specifically, a coating film patterned in a frame shape in a semi-cured state) on a glass substrate was obtained. Subsequently, the second laminate was heated for 30 minutes on a hot plate heated to a temperature of 230 °C., so that the patterned coating film was further cured to obtain a third laminate including a plurality of frame-shaped (quadrangular tube-shaped) rib members (thickness: 100 μm, width: 150 μm, length of one side: 0.9 mm) on a glass substrate.

Subsequently, the third laminate was cut between the rib members with a dicing blade to obtain ribbed substrates (singulated third laminates).

(Adhesive Applying Step)

First, a semiconductor substrate laminated product was prepared in which a semiconductor substrate provided with a light-receiving element and a wiring substrate are bonded with a die bond material interposed therebetween, and an electrode pad on the semiconductor substrate and an electrode pad on the wiring substrate are electrically connected through a metallic wire. Subsequently, an adhesive AD1 was applied so as to surround the light-receiving element of the semiconductor substrate laminated product. Specifically, using an air-pulse type dispenser ("ML-808 GX" manufactured by Musashi Engineering, Inc.) and a tabletop application robot ("IMAGE MASTER 350 PC SMART" manufactured by Musashi Engineering, Inc.) in combination, the adhesive AD1 was applied to the periphery of the light-receiving element with the coating diameter (inner periphery diameter of the coated film) adjusted so that the inner peripheral surface-center line interval in a bonding step described later was 90 μm. In application of the adhesive AD1, a nozzle ("DSHN-M2-0.10F" manufactured by Musashi Engineering, Inc.) having an inner diameter of 100 μm and an outer diameter of 150 μm was used. In application of the adhesive AD1, the air pressure of the dispenser was set to 300 kPa, the interval between the nozzle and the semiconductor substrate (hereinafter, sometimes referred to as a "nozzle interval") was set to 40 μm, and the coating speed was set to 8 mm/s.

(Bonding Step)

Next, the ribbed substrate obtained by the above-described procedure and the semiconductor substrate laminated product coated with the adhesive AD1 were laminated using a flip chip bonder ("CB-505" manufactured by Athlete FA Corporation). Specifically, the semiconductor substrate laminated product coated with the adhesive AD1 was set on a stage of a flip chip bonder, a ribbed substrate-non-formed surface was suctioned and fixed by a collet, and the collet was moved to a position above the adhesive AD1 applied onto the semiconductor substrate laminated product while monitoring was conducted using a camera attached to the flip chip bonder. Here, the inner peripheral surface-center line interval was adjusted to 90 μm. Thereafter, the collet was gradually put positionally close to the semiconductor substrate laminate, and at the time when a load detection sensor attached on the collet side indicated 1 N, the suction of the ribbed substrate by the collet was released to obtain a fourth laminate in which the ribbed substrate and the semiconductor substrate laminated product were laminated with the adhesive AD1 interposed therebetween.

Subsequently, the fourth laminate was exposed under the condition of an integrated exposure amount of 3,000 mJ/cm$^2$, and then heated in an oven at a temperature of 200 °C. for 2 hours. In this way, the rib member and the semiconductor substrate laminated product were bonded. Subsequently, a peripheral portion of the rib member of the heated fourth laminate (a region including a wire) was sealed with a sealing resin, and a solder ball was formed on a surface of the wiring substrate on a side opposite to the semiconductor substrate to obtain an optical semiconductor device of Example 1. The optical semiconductor device of Example 1 had a structure shown in FIG. 5.

Examples 2 to 6, 9 to 11, 13, and 16, and Comparative Examples 1 and 2

Optical semiconductor devices of Examples 2 to 6, 9 to 11, 13, and 16, and Comparative Examples 1 and 2 were obtained by the same method as in Example 1 except that the types of photosensitive compositions, the types of adhesives, the inner peripheral surface-center line intervals, and the air pressures were as shown in Tables 3 and 4 below.

Examples 7 and 8

Optical semiconductor devices of Examples 7 and 8 were obtained by the same method as in Example 1 except that the adhesive was applied using a Mohno type dispenser ("3HD006G30" manufactured by HEISHIN Ltd.) and a tabletop application robot ("JR3300" manufactured by JANOME Corporation) in combination, a nozzle manufactured by HEISHIN Ltd. (model: "FST100," inner diameter: 100 μm, outer diameter: 200 μm) was used instead of the nozzle manufactured by Musashi Engineering, Inc., and the types of adhesives, the inner peripheral surface-center line intervals and the nozzle intervals were as shown in Table 3 below. The rotation speed of the rotor during use of the Mohno type dispenser was as shown in Table 3 below.

Example 12

Figure 8:
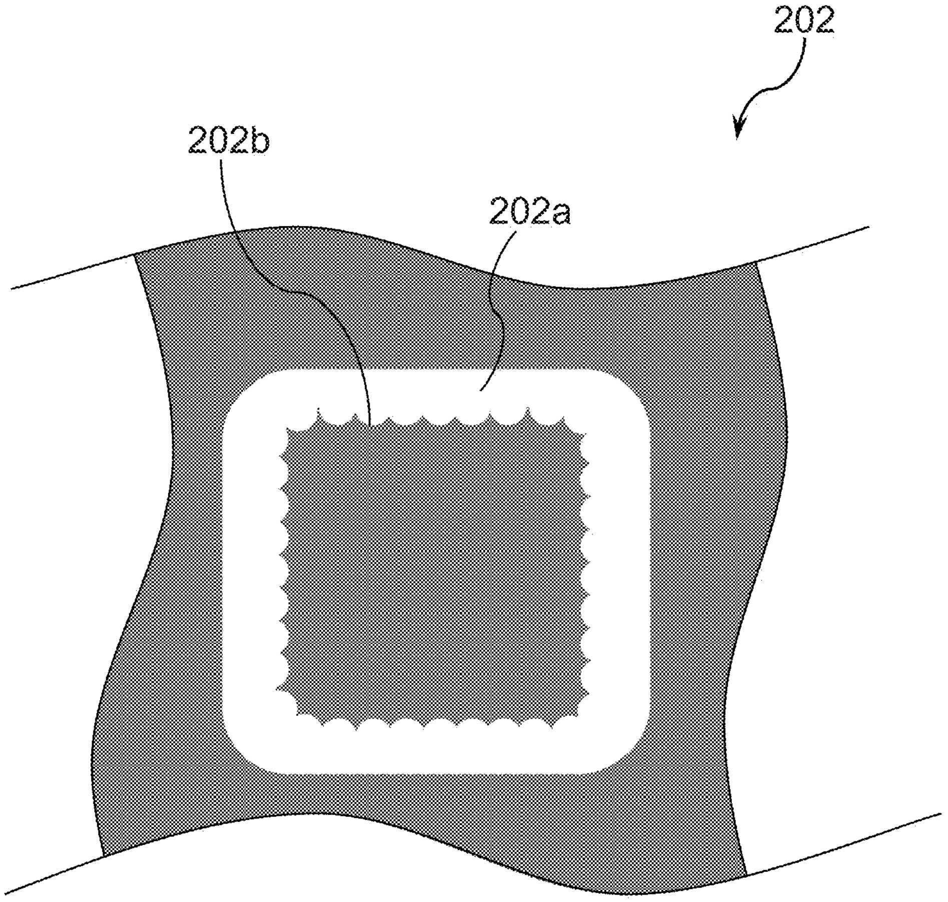
FIG. 8 is a partially enlarged plan view showing an example of a photomask.

An optical semiconductor device of Example 12 was obtained by the same method as in Example 1 except that a photomask 202 shown in FIG. 8 was used instead of the photomask 101 shown in FIG. 6B, and the inner peripheral surface-center line interval was changed to 120 μm. The photomask 202 used had a plurality of 150 μm-wide light-transmitting regions 202*a* in a grid form. Wavy irregularities (recess depth: 50 μm, projection pitch: 58 μm) were formed on an inner surface 202*b* of the light-transmitting region 202*a*, and the wavy irregularities were formed only in a direction perpendicular to the thickness direction of the photomask 202. Irregularities were not formed on the photomask 101.

Examples 14 and 15

Optical semiconductor devices of Examples 14 and 15 were obtained by the same method as in Example 1 except that the type of photosensitive composition was changed and the integrated exposure amount in irradiation of the coating film of the heated first laminate with light was changed to 5,000 mJ/cm$^2$.

<Method for Measuring and Evaluating Physical Properties>

Next, methods for measuring and evaluating various physical properties will be described.

[Surface Shape of Rib Member]

The arithmetic mean roughness Ra of the inner peripheral surface of the rib member of the ribbed substrate and the skewness Ssk of the inner peripheral surface of the rib member of the ribbed substrate were measured using a 3D measurement laser microscope ("LEXT (registered trademark) OLS5100" manufactured by Olympus Corporation). For the measurement of the arithmetic mean roughness Ra, ten measurement locations (evaluation length: 20 μm) were randomly selected on the inner peripheral surface of the rib member, the arithmetic mean roughness Ra in a direction perpendicular to the thickness direction of the rib member was measured at the selected measurement locations, and the arithmetic average of the obtained ten measured values was taken as an evaluation value (arithmetic mean roughness Ra shown in Tables 3 and 4 below). For the measurement of the skewness Ssk, ten measurement locations (square regions of 20 μm×20 μm) were randomly selected on the inner peripheral surface of the rib member, the skewness Ssk was measured at the selected measurement locations, and the arithmetic average of the obtained ten measured values was taken as an evaluation value (skewness Ssk shown in Tables 3 and 4 below).

[Observation of Cross-Section of Adhesive Layer]

Ten measurement locations were randomly selected in the adhesive layer of the optical semiconductor device and the periphery thereof, and the numerical values of following 1) to 6) were determined using a scanning electron microscope ("Miniscope TM3030 Plus" manufactured by Hitachi High-Technologies Corporation, observation magnification: 800 times) in each of cross-sections at the selected measurement locations. For each of 1) to 6), the arithmetic average of the obtained ten numerical values was taken as an evaluation value shown in Tables 3 and 4 below.

1) Thickness of adhesive layer
2) Width of adhesive layer
3) Protrusion length
4) Inner periphery coverage ratio
5) Outer periphery coverage ratio
6) End surface coverage ratio

[Reliability in Thermal Shock Test]

For each of the examples and comparative examples, five optical semiconductor devices were prepared, and each subjected to a thermal shock test using a heat shock testing apparatus ("ES-57L" manufactured by Hitachi Global Life Solutions, Inc.). In the thermal shock test, an operation in which the optical semiconductor device is held in an atmosphere at −50 °C. for 30 minutes and then in an atmosphere at 125 °C. for 30 minutes was carried out 100 times. Subsequently, the optical semiconductor device was observed from the glass substrate side with an optical microscope, and determination was made on the basis of the following criteria. A sample rated "A" or "B" was evaluated as being "excellent in reliability evaluated in a thermal shock." On the other hand, a sample rated "C" was evaluated as being "not excellent in reliability evaluated in a thermal shock."

A: Peeling of the rib member was not observed in any of the five optical semiconductor devices.

B: Peeling (specifically, partial peeling) of the rib member was observed in one of the five optical semiconductor devices, and the number of the locations at which peeling had occurred (the total number of the peeling locations in the five optical semiconductor devices) was 1.

C: Peeling (specifically, partial peeling) of the rib member was observed in at least one of the five optical semiconductor devices, and the number of the locations at which peeling had occurred (the total number of the peeling locations in the five optical semiconductor devices) was 2 or more.

[Ghost Index]

First, for an optical semiconductor device to be evaluated, the number of pixels exceeding a predetermined threshold value (1/100 million of the brightness of a light source) (hereinafter, referred to as a "number of abnormal pixels") was determined using a ghost flare evaluation system ("GCS-2T" manufactured by TSUBOSAKA ELECTRIC Co., Ltd.), and the number of abnormal pixels was divided by the number of all pixels to calculate the value of the number of abnormal pixels/the number of all pixels. Hereinafter, the value obtained by dividing the number of abnormal pixels by the number of all pixels (the number of abnormal pixels/the number of all pixels) may be referred to as an abnormal pixel number ratio.

The abnormal pixel number ratio in Comparative Example 1 was defined as 100, the ratio of each of the numbers of abnormal pixels in Examples 1 to 16 and Comparative Example 2 was normalized, and the normalized value (hereinafter, referred to as a "ghost index") was used as an index of performance enabling suppression of generation of ghosts. When the ghost index was 80 or less, it was determined that generation of ghosts was suppressed. On the other hand, when the ghost index was more than 80, it was determined that generation of ghosts was not suppressed.

<Results>

Tables 3 and 4 show the type of photosensitive composition used, the type of adhesive used, the type of photomask used, the inner peripheral surface-center line interval, the outer diameter of the nozzle, the nozzle interval, the air pressure (Examples 1 to 6, Examples 9 to 16 and Comparative Examples 1 and 2), the rotation speed of the rotor (Examples 7 and 8), the arithmetic mean roughness Ra of the inner peripheral surface of the rib member, the skewness Ssk of the inner peripheral surface of the rib member, the thickness of the adhesive layer, the width of the adhesive layer, the protrusion length, the inner peripheral coverage ratio, the outer peripheral coverage ratio, the end surface coverage ratio, the result of evaluation of reliability in a thermal shock test, and the ghost index for Examples 1 to 16 and Comparative Examples 1 and 2. Note that "101" in the "type of photomask" field of Tables 3 and 4 means the photomask 101 (see FIG. 6B). Note that "202" in the "type of photomask" field of Table 4 means the photomask 202 (see FIG. 8).

TABLE 3

| | Example 1 | Example 2 | Example 3 | Example 4 | Example 5 | Example 6 | Example 7 | Example 8 | Example 9 |
|---|---|---|---|---|---|---|---|---|---|
| Type of photosensitive composition | PS1 | PS1 | PS1 | PS1 | PS1 | PS1 | PS1 | PS1 | PS1 |
| Type of adhesive | AD1 | AD1 | AD1 | AD1 | AD2 | AD3 | AD4 | AD5 | AD6 |
| Type of photomask | 101 | 101 | 101 | 101 | 101 | 101 | 101 | 101 | 101 |
| Inner peripheral surface-center line interval [μm] | 90 | 120 | 135 | 150 | 120 | 90 | 120 | 120 | 90 |
| Outer diameter of nozzle [μm] | 150 | 150 | 150 | 150 | 150 | 150 | 200 | 200 | 150 |
| Nozzle interval [μm] | 40 | 40 | 40 | 40 | 40 | 40 | 50 | 50 | 40 |
| Air pressure [kPa] or rotation speed of rotor [$min^{-1}$] | 300 | 300 | 300 | 300 | 150 | 400 | 5 | 10 | 300 |
| Arithmetic mean roughness Ra [nm] | 12 | 12 | 12 | 12 | 12 | 12 | 12 | 12 | 12 |
| Skewness Ssk | 0.02 | 0.02 | 0.02 | 0.02 | 0.02 | 0.02 | 0.02 | 0.02 | 0.02 |
| Thickness of adhesive layer [μm] | 10 | 10 | 10 | 10 | 10 | 10 | 10 | 10 | 20 |
| Width of adhesive layer [μm] | 150 | 150 | 150 | 150 | 150 | 100 | 200 | 200 | 150 |
| Protrusion length [μm] | 15 | 30 | 45 | 75 | 30 | 10 | 45 | 45 | 15 |
| Inner periphery coverage ratio [%] | 0 | 0 | 0 | 0 | 0 | 0 | 20 | 20 | 0 |
| Outer periphery coverage ratio [%] | 30 | 50 | 100 | 100 | 100 | 10 | 100 | 100 | 10 |
| End surface coverage ratio [%] | 93 | 83 | 77 | 67 | 99 | 93 | 100 | 100 | 93 |
| Reliability in thermal shock test | A | A | A | B | A | B | A | A | B |
| Ghost index | 60 | 60 | 60 | 60 | 60 | 60 | 80 | 80 | 60 |

TABLE 4

| | Example 10 | Example 11 | Example 12 | Example 13 | Example 14 | Example 15 | Example 16 | Comparative Example 1 | Comparative Example 2 |
|---|---|---|---|---|---|---|---|---|---|
| Type of photosensitive composition | PS1 | PS1 | PS1 | PS2 | PS3 | PS4 | PS5 | PS1 | PS1 |
| Type of adhesive | AD2 | AD7 | AD1 | AD1 | AD1 | AD1 | AD1 | AD1 | AD1 |
| Type of photomask | 101 | 101 | 202 | 101 | 101 | 101 | 101 | 101 | 101 |

TABLE 4-continued

| | Example 10 | Example 11 | Example 12 | Example 13 | Example 14 | Example 15 | Example 16 | Comparative Example 1 | Comparative Example 2 |
|---|---|---|---|---|---|---|---|---|---|
| Inner peripheral surface-center line interval [μm] | 135 | 90 | 120 | 90 | 90 | 90 | 90 | 75 | 75 |
| Outer diameter of nozzle [μm] | 150 | 150 | 150 | 150 | 150 | 150 | 150 | 150 | 150 |
| Nozzle interval [μm] | 40 | 40 | 40 | 40 | 40 | 40 | 40 | 40 | 40 |
| Air pressure [kPa] | 300 | 300 | 300 | 300 | 300 | 300 | 300 | 350 | 300 |
| Arithmetic mean roughness Ra [nm] | 12 | 12 | 50000 | 581 | 450 | 15 | 17 | 12 | 12 |
| Skewness Ssk | 0.02 | 0.02 | 0.02 | −0.39 | 0.21 | 0.14 | 0.04 | 0.02 | 0.02 |
| Thickness of adhesive layer [μm] | 10 | 10 | 10 | 10 | 10 | 10 | 10 | 10 | 10 |
| Width of adhesive layer [μm] | 200 | 150 | 150 | 150 | 150 | 150 | 150 | 200 | 150 |
| Protrusion length [μm] | 45 | 15 | 30 | 15 | 15 | 15 | 15 | 45 | 0 |
| Inner periphery coverage ratio [%] | 20 | 0 | 0 | 0 | 0 | 0 | 0 | 100 | 0 |
| Outer periphery coverage ratio [%] | 100 | 30 | 50 | 30 | 30 | 30 | 30 | 100 | 0 |
| End surface coverage ratio [%] | 100 | 93 | 83 | 93 | 93 | 93 | 93 | 100 | 98 |
| Reliability in thermal shock test | A | A | A | A | A | A | A | A | C |
| Ghost index | 80 | 60 | 55 | 20 | 25 | 35 | 50 | 100 | 60 |

In the optical semiconductor devices of Examples 1 to 16, the protrusion length was more than 0 μm. That is, in the optical semiconductor devices of Examples 1 to 16, the adhesive layer protruded outward from the outer peripheral surface of the rib member when the rib member and the adhesive layer were viewed from the glass substrate side. In the optical semiconductor devices of Examples 1 to 16, the inner peripheral surface coverage ratio was 30% or less.

The optical semiconductor devices of Examples 1 to 16 were rated "A" or "B" for reliability in a thermal shock test. Thus, the optical semiconductor devices of Examples 1 to 16 were excellent in reliability evaluated in a thermal shock test. In the optical semiconductor devices of Examples 1 to 16, the ghost index was 80 or less. Thus, the optical semiconductor devices of Examples 1 to 16 suppressed generation of ghosts.

In the optical semiconductor device of Comparative Example 1, the inner peripheral coverage ratio was more than 30%. In the optical semiconductor device of Comparative Example 2, the protrusion length was 0 μm. That is, in the optical semiconductor device of Comparative Example 2, the adhesive layer did not protrude outward from the outer peripheral surface of the rib member when the rib member and the adhesive layer were viewed from the glass substrate side.

In the optical semiconductor device of Comparative Example 1, the ghost index was 100. Thus, the optical semiconductor device of Comparative Example 1 did not suppress generation of ghosts. The optical semiconductor device of Comparative Example 2 was rated "C" for reliability in a thermal shock test. Thus, the optical semiconductor device of Comparative Example 2 was not excellent in reliability evaluated in a thermal shock test.

The above results show that the present invention can provide an optical semiconductor device which is excellent in reliability evaluated in a thermal shock test while suppressing generation of optical noise.

DESCRIPTION OF REFERENCE CHARACTERS

10, 50 optical semiconductor device
11 light-receiving element
12 semiconductor substrate
13 rib member
14 transparent substrate
15 adhesive layer

The invention claimed is:

1. An optical semiconductor device comprising:
a semiconductor substrate provided with a light-receiving element, a frame-shaped rib member, and a transparent substrate in this order; and
an adhesive layer bonding the rib member and the semiconductor substrate to each other, wherein
the rib member and the adhesive layer are provided so as to surround the light-receiving element,
the adhesive layer protrudes outward from an outer peripheral surface of the rib member when the rib member and the adhesive layer are viewed from a transparent substrate side,
an inner coverage ratio of the adhesive layer on an inner peripheral surface of the rib member is 25% or less, and
an outer coverage ratio of the adhesive layer on the outer peripheral surface of the rib member is 30% or more.

2. The optical semiconductor device according to claim 1, wherein an end coverage ratio of the adhesive layer on an end surface of the rib member on the semiconductor substrate side is less than 100%.

3. The optical semiconductor device according to claim 2, wherein the end coverage ratio of the adhesive layer on the end surface of the rib member on the semiconductor substrate side is 60% or more.

4. The optical semiconductor device according to claim 1, wherein an arithmetic mean roughness Ra of the inner peripheral surface of the rib member is 50 nm or more and 3,000 nm or less.

5. The optical semiconductor device according to claim 1, wherein the rib member includes a cured product of a photosensitive composition, the photosensitive composition containing a curable compound having a polymerizable group, and a photopolymerization initiator, and has alkali solubility.

6. The optical semiconductor device according to claim 5, wherein the photosensitive composition further contains a coloring agent.

7. The optical semiconductor device according to claim 1, wherein an end coverage ratio of the adhesive layer on an end surface of the rib member on the semiconductor substrate side is 60% or more and 93% or less.

8. The optical semiconductor device according to claim 1, wherein an end coverage ratio of the adhesive layer on an end surface of the rib member on the semiconductor substrate side is 70% or more.

* * * * *